US008300444B2

(12) United States Patent
Nagashima et al.

(10) Patent No.: US 8,300,444 B2
(45) Date of Patent: Oct. 30, 2012

(54) NONVOLATILE SEMICONDUCTOR MEMORY DEVICE

(75) Inventors: Hiroyuki Nagashima, Yokohama (JP); Koichi Kubo, Yokohama (JP); Yasuyuki Fukuda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 12/680,582

(22) PCT Filed: Oct. 17, 2008

(86) PCT No.: PCT/JP2008/069285
§ 371 (c)(1),
(2), (4) Date: Mar. 29, 2010

(87) PCT Pub. No.: WO2009/051274
PCT Pub. Date: Apr. 23, 2009

(65) Prior Publication Data
US 2010/0226164 A1 Sep. 9, 2010

(30) Foreign Application Priority Data
Oct. 17, 2007 (JP) ................................. 2007-269771

(51) Int. Cl.
*G11C 11/00* (2006.01)
(52) U.S. Cl. .......................................... 365/48; 365/163
(58) Field of Classification Search .................... 365/148
See application file for complete search history.

(56) References Cited
U.S. PATENT DOCUMENTS
5,361,227 A    11/1994  Tanaka et al.
5,452,251 A *   9/1995  Akaogi et al. ................. 365/200
5,969,993 A    10/1999  Takeshima
6,744,670 B2 *  6/2004  Tamada et al. ........... 365/185.19
7,305,596 B2 * 12/2007  Noda et al. ..................... 714/718
7,391,642 B2 *  6/2008  Gordon et al. ................. 365/163
7,529,124 B2 *  5/2009  Cho et al. ....................... 365/163
7,751,233 B2 *  7/2010  Kang et al. ..................... 365/163
2004/0125653 A1  7/2004  Tran et al.
2004/0130938 A1  7/2004  Hamaguchi
2004/0174739 A1  9/2004  Morimoto et al.
2006/0026489 A1  2/2006  Noda et al.
2006/0126380 A1  6/2006  Osada et al.
(Continued)

FOREIGN PATENT DOCUMENTS
CN          101000795 A        7/2007
(Continued)

OTHER PUBLICATIONS
Extended Supplementary European Search Report dated Oct. 28, 2010 in corresponding European Application No. 08 84 0149.
(Continued)

*Primary Examiner* — Son Mai
(74) *Attorney, Agent, or Firm* — Oblon, Spivak, McClelland, Maier & Neustadt, L.L.P.

(57) ABSTRACT

A nonvolatile semiconductor memory device comprises a memory cell array of electrically erasable programmable nonvolatile memory cells arranged in matrix, each memory cell using a variable resistor. A pulse generator generates plural types of write pulses for varying the resistance of the variable resistor based on write data. A selection circuit applies write pulses generated by the pulse generator to the memory cell. A sense amplifier executes verify read to the memory cell. A status decision circuit decides the verify result based on the output from the sense amplifier. A control circuit executes additional write to the memory cell based on the verify result from the status decision circuit.

15 Claims, 24 Drawing Sheets

U.S. PATENT DOCUMENTS

| | | |
|---|---|---|
| 2006/0166455 A1 | 7/2006 | Gordon et al. |
| 2006/0268595 A1 | 11/2006 | Bill et al. |
| 2007/0008770 A1 | 1/2007 | Nagao et al. |
| 2008/0123389 A1 | 5/2008 | Cho |

FOREIGN PATENT DOCUMENTS

| | | |
|---|---|---|
| EP | 1 426 975 A2 | 6/2004 |
| EP | 1 426 975 A3 | 6/2004 |
| EP | 1 486 985 A2 | 12/2004 |
| EP | 1 486 985 A3 | 12/2004 |
| JP | 6 76586 | 3/1994 |
| JP | 8 329694 | 12/1996 |
| JP | 11 16380 | 1/1999 |
| JP | 2002 541613 | 12/2002 |
| JP | 2004 158143 | 6/2004 |
| JP | 2004 185723 | 7/2004 |
| JP | 2005 50424 | 2/2005 |
| JP | 2005 522045 | 7/2005 |
| JP | 2006 155700 | 6/2006 |
| JP | 2006 202411 | 8/2006 |
| JP | 2007 18615 | 1/2007 |
| JP | 2008-140535 | 6/2008 |
| WO | 2006 130438 | 12/2006 |

OTHER PUBLICATIONS

U.S. Appl. No. 12/650,006, filed Dec. 30, 2009, Tokiwa.
Japanese Office Action for Application No. 2007-269771, mailed Mar. 21, 2012.
Japanese Office Action, mailed Sep. 4, 2012, for Patent Application No. 2007-269771 (with English translation).
Chinese Office Action mailed Jun. 18, 2012 for application No. 200880112046.5 (with English translation).

* cited by examiner (a) Schottky Structure (d) MIM Structure (b) PN Structure (e) SIS Structure (c) PIN Structure

NONVOLATILE SEMICONDUCTOR MEMORY DEVICE

TECHNICAL FIELD

The present invention relates to a nonvolatile semiconductor memory device using variable resistors, and more particularly to a nonvolatile semiconductor memory device operative to verify at the time of write.

BACKGROUND ART

Electrically erasable programmable nonvolatile memories include a flash memory as well known in the art, which comprises a memory cell array of NAND-connected or NOR-connected memory cells having a floating gate structure. A ferroelectric memory is also known as a nonvolatile fast random access memory.

On the other hand, technologies of patterning memory cells much finer include a resistance variable memory, which uses a variable resistor in a memory cell as proposed (Patent Document 1). The resistance variable memory of such the type utilizes the fact that the resistance ratio of crystal to non-crystal of chalcogenide glass is as large as 100:1 or more, and stores the different resistance states as information. The resistance variable memory may include a serial circuit of a Schottky diode and a variable resistor in place of the transistor to configure a memory cell. Accordingly, it can be easily stacked in layers and three-dimensionally structured to achieve much higher integration as an advantage (Patent Document 2). Each memory cell is, however, just allowed to control two states: a high-resistance state and a low-resistance state, without estimating write.

[Patent Document 1] JP 2002-541613T
[Patent Document 2] JP 2005-522045T

DISCLOSURE OF INVENTION

Technical Problem

The present invention has an object to provide a nonvolatile semiconductor memory device capable of improving the quality of write by verify in a nonvolatile semiconductor device using variable resistors.

Technical Solution

In an aspect the present invention provides a nonvolatile semiconductor memory device, comprising: a memory cell array of electrically erasable programmable nonvolatile memory cells arranged in matrix, each memory cell using a variable resistor; a pulse generator operative to generate plural types of write pulses for varying the resistance of the variable resistor based on write data; a selection circuit operative to apply write pulses generated by the pulse generator to the memory cell; a sense amplifier operative to execute verify read to the memory cell; a status decision circuit operative to decide the verify result based on the output from the sense amplifier; and a control circuit operative to execute additional write to the memory cell based on the verify result from the status decision circuit.

In another aspect the present invention provides a nonvolatile semiconductor memory device, comprising: a memory cell array of electrically erasable programmable nonvolatile memory cells arranged in matrix, each memory cell using a variable resistor; a pulse generator operative to generate plural types of write pulses for varying the resistance of the variable resistor in three or more stages based on ternary or higher valued write data; a selection circuit operative to apply write pulses generated by the pulse generator to the memory cell; a sense amplifier operative to execute verify read to the memory cell; a status decision circuit operative to decide the verify result based on the output from the sense amplifier; and a control circuit operative to execute additional write to the memory cell based on the verify result from the status decision circuit.

In yet another aspect the present invention provides a nonvolatile semiconductor memory device, comprising: a memory cell array including a cell array of electrically erasable programmable nonvolatile memory cells arranged in matrix and an ECC (Error Correction Code) area in part, each memory cell using a variable resistor; a pulse generator operative to generate plural types of write pulses for varying the resistance of the variable resistor based on write data; a selection circuit operative to apply write pulses generated by the pulse generator to the memory cell; a sense amplifier operative to execute verify read to the memory cell; a status decision circuit operative to decide whether the verify result falls within an ECC relievable range based on the output from the sense amplifier; and a control circuit operative to execute additional write to the memory cell based on the verify result from the status decision circuit.

Effect of the Invention

In accordance with the present invention, it is made possible to improve the quality of write by verify in a nonvolatile semiconductor device using variable resistors.

BEST MODE FOR CARRYING OUT THE INVENTION

The embodiments of the invention will now be described with reference to the drawings.

First Embodiment

Entire Configuration

Figure 1:
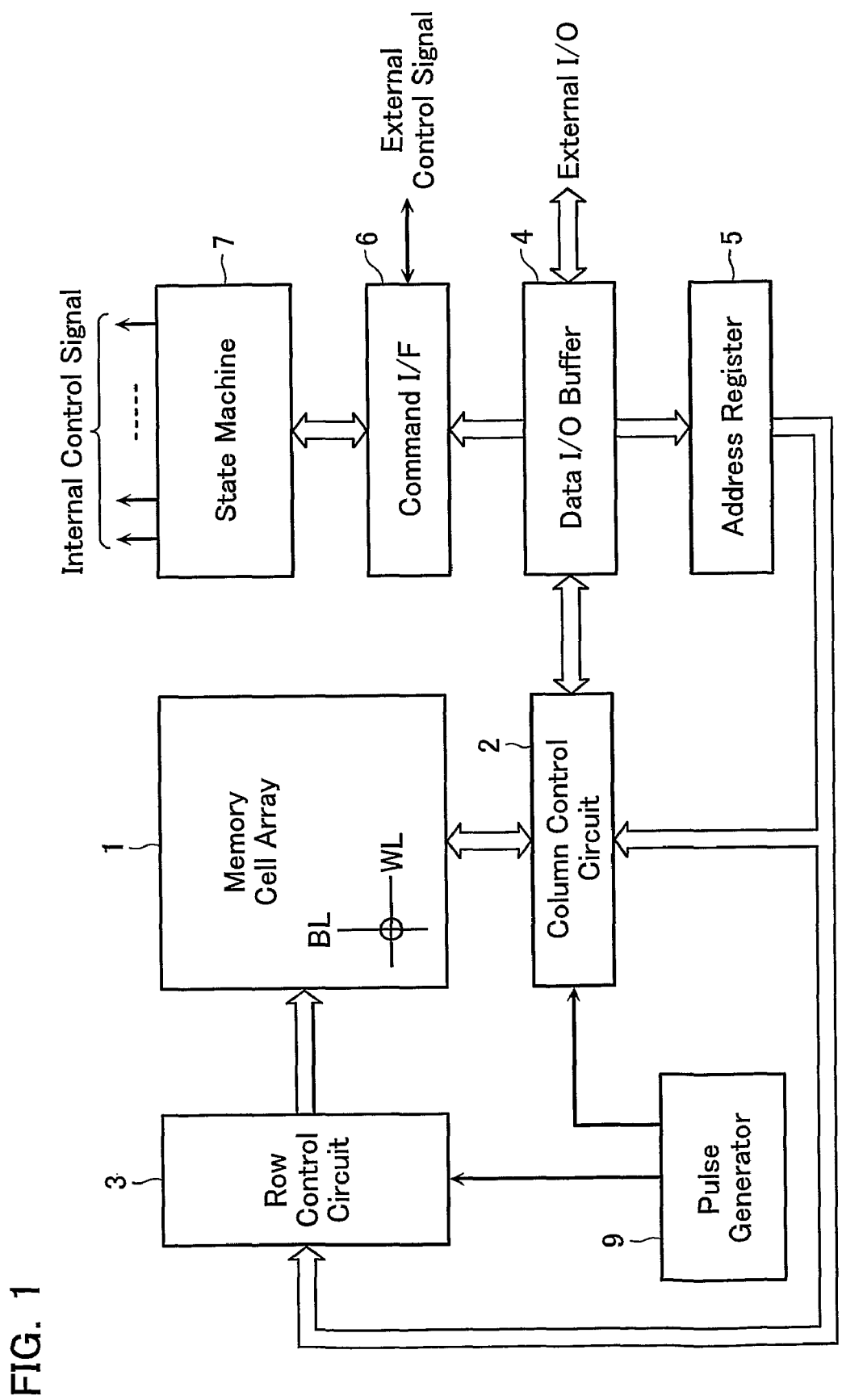
FIG. 1 is a block diagram of a nonvolatile memory according to a first embodiment of the present invention.

FIG. 1 is a block diagram of a nonvolatile memory according to a first embodiment of the present invention.

The nonvolatile memory comprises a memory cell array 1 of memory cells arranged in matrix, each memory cell including a later-described resistance variable element such as a PCRAM (phase change element) or a ReRAM (variable resistor). A column control circuit 2 is provided on a position adjacent to the memory cell array 1 in the bit line BL direction. Column control circuit 2 controls the bit line BL in the memory cell array 1 to erase data from the memory cell, write data in the memory cell, and read data out of the memory cell. A row control circuit 3 is provided on a position adjacent to the memory cell array 1 in the word line WL direction. Row control circuit 3 selects the word line WL in the memory cell array 1 and applies voltages required to erase data from the memory cell, write data in the memory cell, and read data out of the memory cell.

A data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3. A command fed from the host to the data I/O buffer 4 is sent to a command interface 6. The command interface 6 receives an external control signal from the host and decides whether the data fed to the data I/O buffer 4 is write data, a command or an address. If the data is a command, then the command interface transfers it as a received command signal to a state machine 7. The state machine 7 manages the entire nonvolatile memory to receive commands from the host, read, write, erase, and execute data I/O management. The external host can also receive status information managed by the state machine 7 and decide the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3.

Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.

[Memory Cell Array and Peripheral Circuits]

Figure 2:
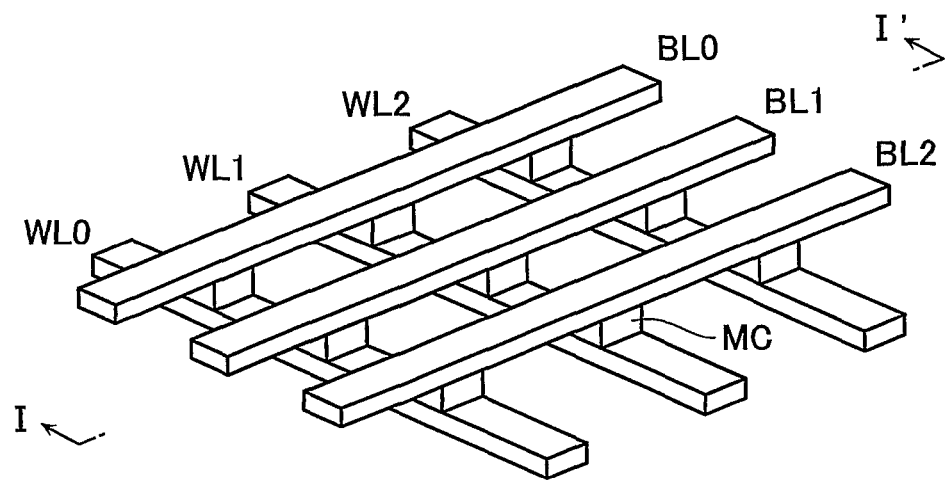
FIG. 2 is a perspective view of part of a memory cell array in the nonvolatile memory according to the same embodiment.
Figure 3:
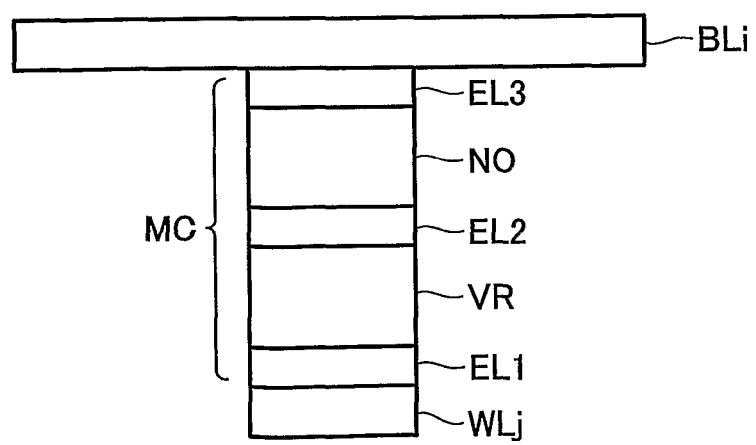
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural word lines WL0-WL2 as first lines disposed in parallel, which cross plural bit lines BL0-BL2 as second lines disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistor VR and a non-ohmic element NO as shown in FIG. 3.

The variable resistor VR can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN, TiOx, NbTiOx, Si. A metal film capable of achieving uniform orientation may also be interposed. A buffer layer, a barrier metal layer and an adhesive layer may further be interposed.

The variable resistor VR may include one such as chalcogenide that varies the resistance through the phase change between the crystal state and the non-crystal state (PCRAM); and one that comprises a composite compound containing cations of a transition element and varies the resistance through migration of cations (ReRAM).

Figure 4:
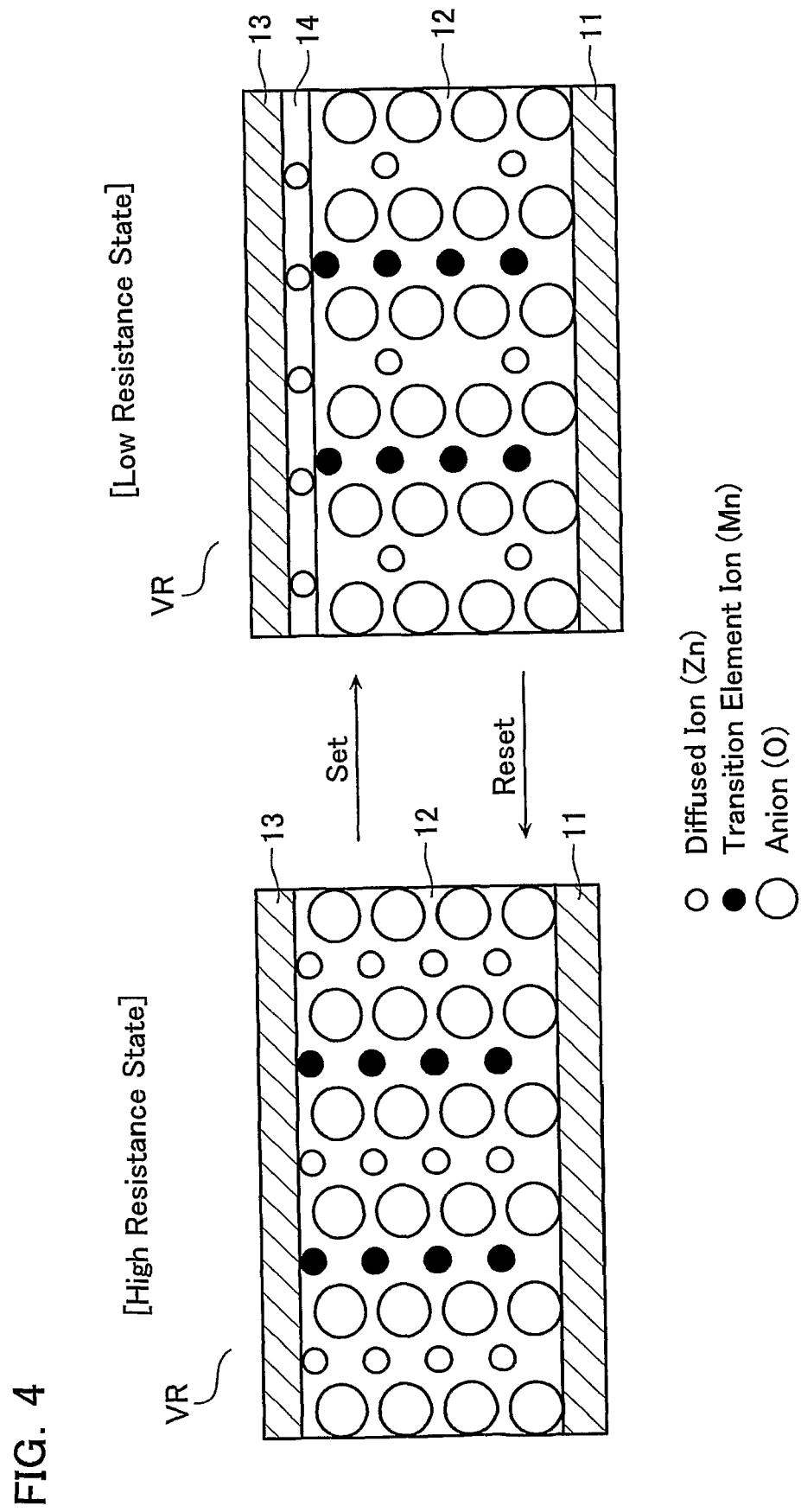
FIG. 4 is a schematic cross-sectional view showing a variable resistor example in the same embodiment.
Figure 5:
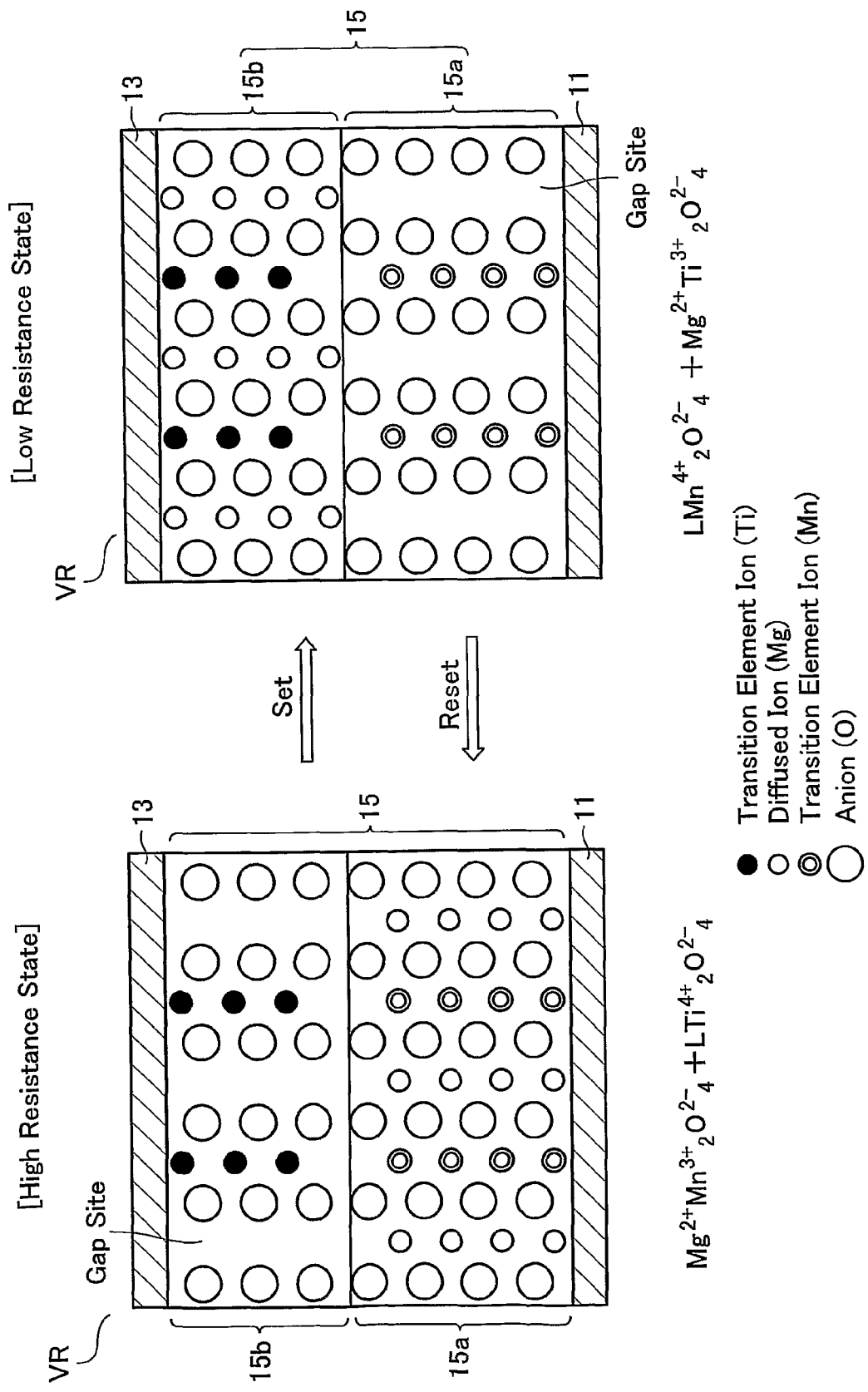
FIG. 5 is a schematic cross-sectional view showing another variable resistor example in the same embodiment.

FIGS. 4 and 5 show examples of the latter variable resistor. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$) a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On reading, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has gap sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition reduction ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) may be reset to the erased state (high-resistance state) by supplying a large current flow in the recording layer 15 for a sufficient time for Joule heating to facilitate the oxidation reduction reaction in the recording layer 15, like in the preceding example. Application of an electric field in the opposite direction from that at the time of setting may also allow reset.

Figure 6:
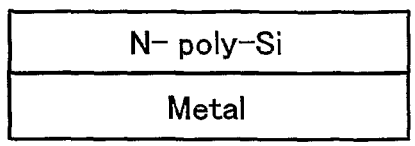
FIG. 6 is a schematic cross-sectional view showing a non-ohmic element example in the same embodiment.
Figure 6:
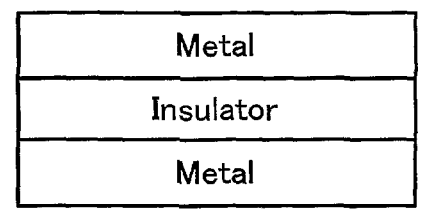
Figure 6:
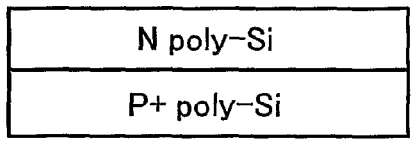
Figure 6:
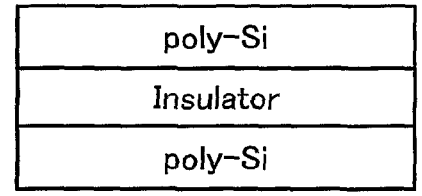
Figure 6:
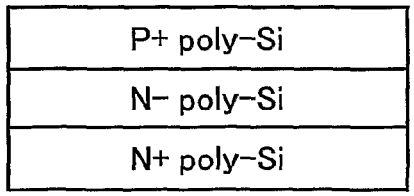

The non-ohmic element NO may include various diodes such as (a) a Schottky diode, (b) a PN-junction diode, (c) a PIN diode and may have (d) a MIM (Metal-Insulator-Metal) structure, and (e) a SIS (Silicon-Insulator-Silicon) structure as shown in FIG. 6. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistor VR may be arranged in the opposite up/down relation from FIG. 3. Alternatively, the non-ohmic element NO may have the up/down-inverted polarity.

Figure 7:
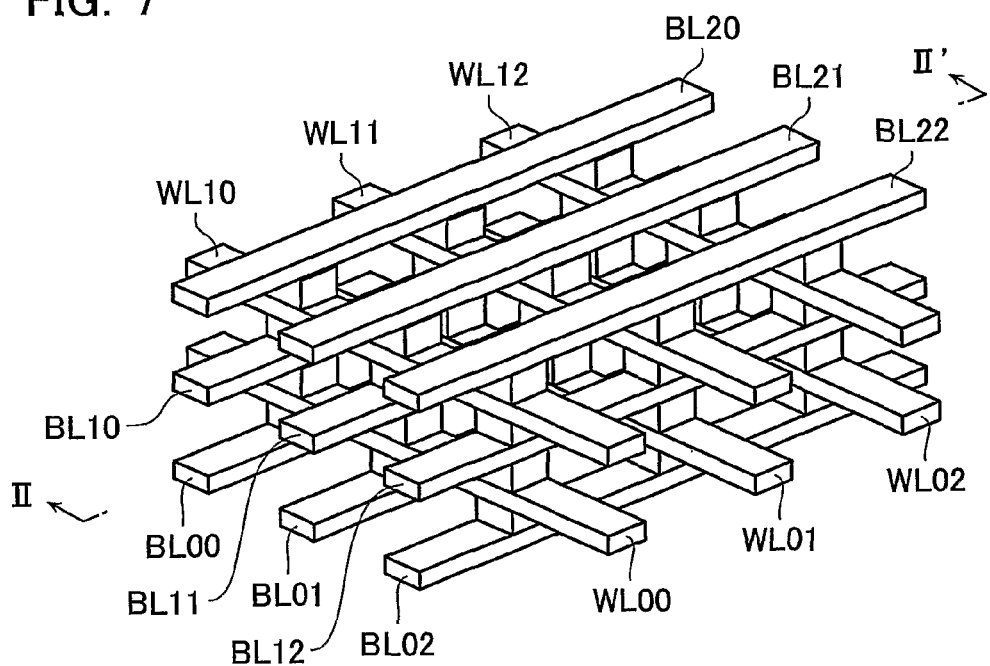
FIG. 7 is a perspective view of part of a memory cell array according to another embodiment of the present invention.
Figure 8:
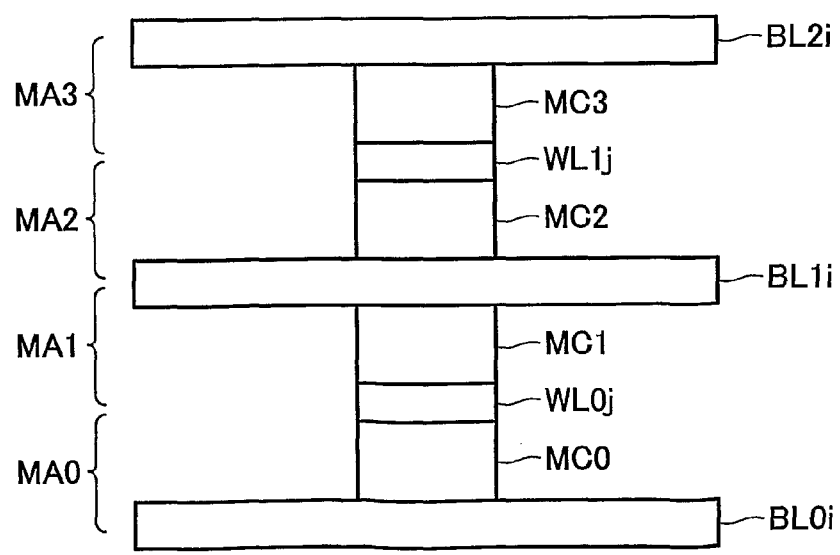
FIG. 8 is a cross-sectional view of one memory cell taken along II-II' line and seen from the direction of the arrow in FIG. 7.

Plural such memory structures described above may be stacked to form a three-dimensional structure as shown in FIG. 7. FIG. 8 is a cross-sectional view showing an II-II' section in FIG. 7. The shown example relates to a memory cell array of a 4-layer structure having cell array layers MA0-MA3. A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3. In place of the line/cell/line/cell repetition, an interlayer insulator may be interposed as a line/cell/line/interlayer-insulator/line/cell/line between cell array layers.

The memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 9:
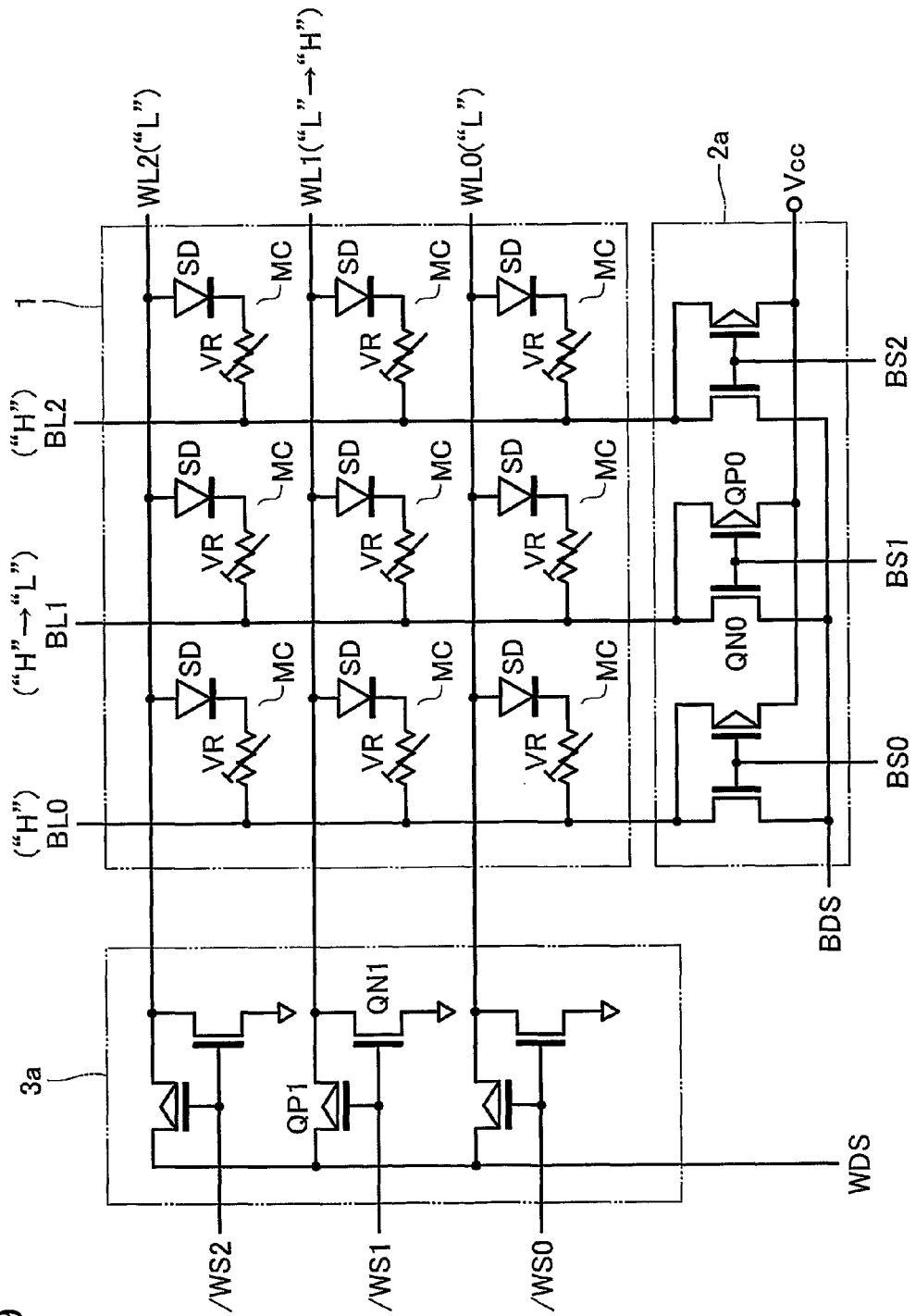
FIG. 9 is a circuit diagram of the memory cell array and peripheral circuits thereof in the nonvolatile memory according to the same embodiment.

FIG. 9 is a circuit diagram of the memory cell array 1 using a diode SD as the non-ohmic element NO and peripheral circuits thereof. For simplicity, the description advances on the assumption that the memory has a single-layered structure.

In FIG. 9, the diode contained in the memory cell MC has an anode connected to the word line WL and a cathode connected to the bit line BL via the variable resistor VR. Each bit line BL has one end connected to a selection circuit 2a, which is part of the column control circuit 2. Each word line WL has one end connected to a selection circuit 3a, which is part of the row control circuit 3.

The selection circuit 2a includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a bit-line side drive sense line BDS, which is used to apply a write pulse and supply a detection current at the time of data read. The transistors QP0, QN0 have a common drain connected to the bit line BL, and a common gate supplied with a bit-line selection signal BSi for selecting each bit line BL.

The selection circuit 3a includes a selection PMOS transistor QP1 and a selection NMOS transistor QN1, provided at each word line WL, of which gates and drains are commonly connected. The selection PMOS transistor QP1 has a source connected to a word-line side drive sense line WDS, which is used to apply a write pulse and supply a detection current at the time of data read. The selection NMOS transistor QN1 has a source connected to the low potential source Vss. The transistors QP1, QN1 have a common drain connected to the word line WL and a common gate supplied with a word-line selection signal /WSi for selecting each word line WL.

The example shown above is suitable for selecting the memory cells individually. In contrast, in batch read of data from plural memory cells MC connected to the word line WL1, sense amplifiers are arranged individually for the bit lines BL0-BL2, and the bit lines BL0-BL2 are connected to the sense amplifiers individually via the selection circuit 2a.

Figure 10:
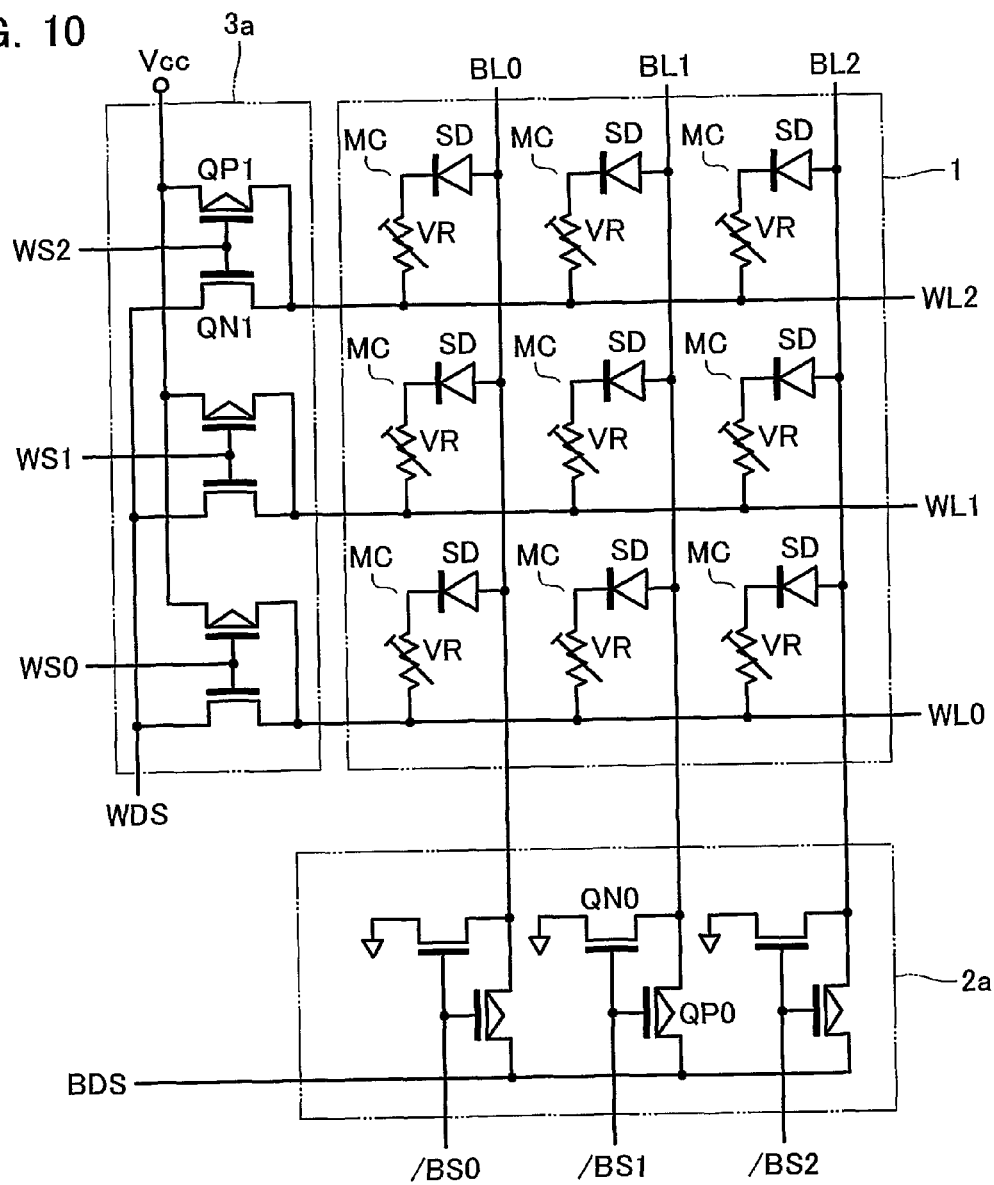
FIG. 10 is a circuit diagram of another memory cell array and peripheral circuits thereof in the nonvolatile memory according to the same embodiment.

FIG. 10 is a circuit diagram showing another example of the memory cell array 1. This memory cell array 1 includes diodes SD of which polarity is reversed from those in the memory cell array 1 shown in FIG. 9. The diode contained in the memory cell MC has an anode connected to a bit line BL and a cathode connected to a word line WL via the variable resistor VR. In the selection circuit 2a, the selection PMOS transistor QP0 has a source connected to the bit-line side drive sense line BDS, and the selection NMOS transistor QN0 has a source connected to the low potential source Vss. In the selection circuit 3a, the selection PMOS transistor QP1 has a source connected to the high potential source Vcc, and the selection NMOS transistor QN1 has a source connected to the word-line side drive sense line WDS. In the case of this circuit, current flows from the bit line BL toward the word line WL in the opposite direction than the memory cell array 1 of FIG. 9. The selection circuits 2a, 3a also have the opposite polarities from those in FIG. 9.

[Binary Data Reading]

Binary data reading is described next.

Figure 11:
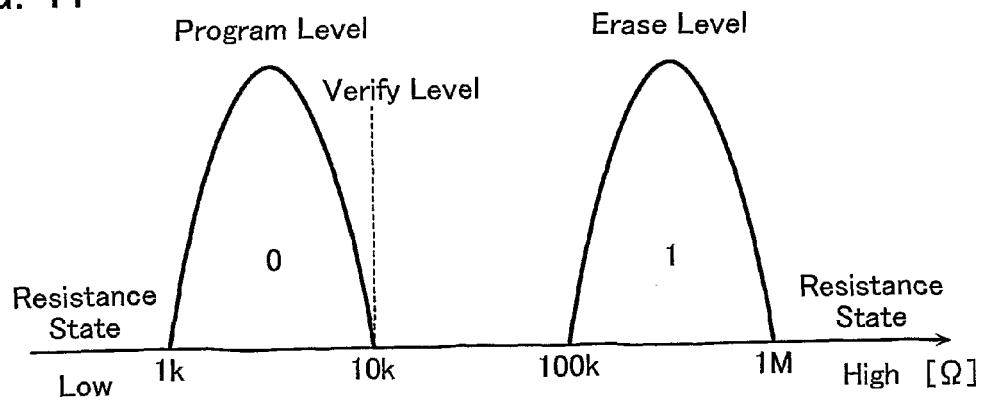
FIG. 11 is a graph showing resistance distributions and data in a memory cell in the case of binary data.

In the above-described circuits, data is stored in each memory cell MC as the resistance of the variable resistor VR. In an example of the circuit shown in FIG. 9, the word-line selection signals /WS0, /WS1, . . . are at "H" level and the bit-line selection signals BS0, BS1, . . . are at "L" level, for example, in this non-selected state. In this case, all word lines WL are set at "L" level and all bit lines BL at "H" level. In the non-selected state, diodes SD in all memory cells MC are reverse-biased and turned off and thus no current flows in the variable resistor VR. Selection of a middle memory cell MC linked to the word line WL1 and the bit line BL1 is considered herein. In this case, the row control circuit 3 sets the word-line selection signal /WS1 at "L" level and the column control circuit 2 sets the bit-line selection signal BS1 at "H" level. As a result, the word line WL1 is connected to the word-line side drive sense line WDS and the bit line BL1 is connected to the bit-line side drive sense line BDS. Accordingly, application of "H" level to the drive sense line WDS and "L" level to the drive sense line BDS results in the word line WL1 at "H" level and the bit line BL1 at "L" level. Thus, in the selected cell, the diode SD is forward-biased to allow current to flow. The amount of current flowing in the selected cell can be determined from the resistance of the variable resistor VR. Accordingly, by sensing the value of the current, the data can be read out. Namely, by relating the erased high-resistance state to "1" and the programmed low-resistance state to "0" as shown in FIG. 11, the sensed current can be detected as "1" for a small value and as "0" for a large value.

The selected word line WL1 and non-selected bit lines BL are at "H" level and accordingly no current flows in them. Non-selected word lines WL and the selected bit line BL1 are at "L" level and accordingly no current flows in them as well. Therefore, no current flows in other memory cells than the selected memory cell.

In the example shown above, the memory cells are selected individually. In contrast, in batch read of data from plural memory cells MC connected to the word line WL1, the sense amplifiers are connected individually to the bit lines BL0-BL2 to select plural read-target bit lines with the bit-line selection signal BS.

FIGS. 12-15 show examples of the sense amplifier applicable to the above-described cell array.

Figure 12:
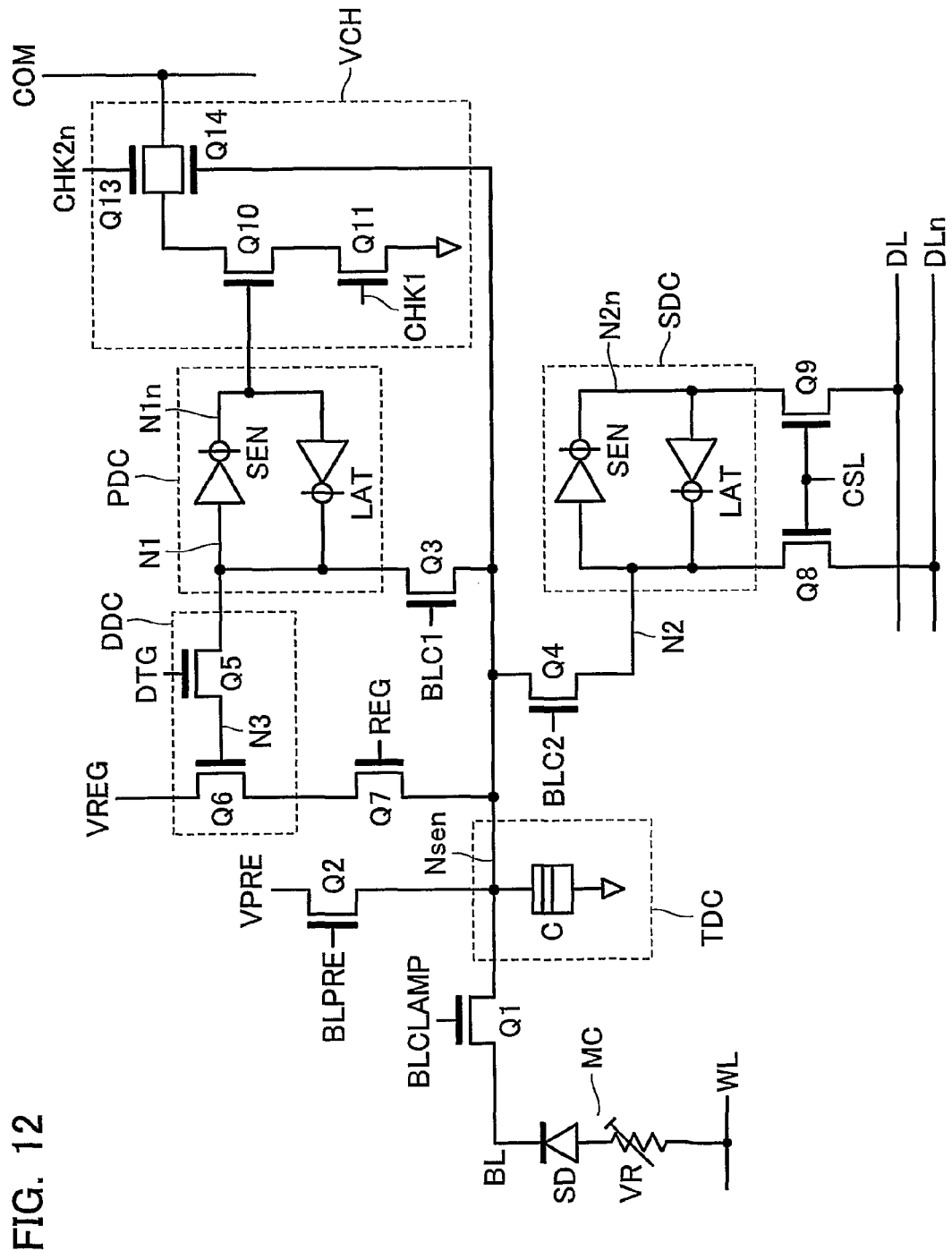
FIG. 12 is a circuit diagram showing a first configuration of a sense amplifier in the same embodiment.

The sense amplifier shown in FIG. 12 corresponds to the circuit of FIG. 9, which is a single-ended sense amplifier of the voltage detection type. A sense node Nsen is connected via a clamp NMOS transistor Q1 to the bit line BL. The clamp NMOS transistor Q1 clamps the bit-line voltage and serves as a pre-sense amplifier. The sense node Nsen is also connected to a precharge NMOS transistor Q2 used to precharge the bit line.

The sense node Nsen is connected to a charge holding capacitor C, which configures a data storage circuit TDC used to temporarily hold the sensed data.

The sense node Nsen is connected via a transfer NMOS transistor Q3 to a data latch PDC as a main data storage circuit. The sense node Nsen is also connected via a transfer NMOS transistor Q4 to a data latch SDC as a data storage circuit used to achieve data communications with the data I/O buffer 4. Therefore, the data latch SDC is connected to the data lines DL, DLn via column selection gates Q8, Q9, which are driven with the column selection signal CSL.

The sense amplifier thus configured executes sense operation as follows. First, the word line WL and the bit line BL connected to the memory cell MC targeted for data read are selected, followed by bringing the word line WL at "H" level and the bit line BL at "L" level while keeping the clamp NMOS transistor Q1 turned off. As a result, the bit line BL is supplied with a current flow, of which value corresponds to the resistance of the memory cell MC, such that charge is stored in the parasitic capacity on the bit line BL in accordance with the value of the current. Specifically, the potential on the bit line BL elevates if the memory cell MC has a low resistance while the potential on the bit line BL lowers if the memory cell MC has a high resistance. Simultaneously or subsequently, the precharge NMOS transistor Q2 is turned on to precharge the charge holding capacitor C. Then, the clamp NMOS transistor Q1 is given VBLC+Vt at the gate (Vt denotes the threshold voltage of the clamp NMOS transistor Q1). The transistor Q1 remains turned off if the voltage on the bit line BL is higher than VBLC. In contrast, the transistor Q1 turns off and discharges the charge on the charge holding capacitor C to the bit line BL if the voltage on the bit line BL is lower than VBLC. Therefore, the voltage on the sense node Nsen exhibits "H" when the memory cell MC has a low resistance and "L" when it has a high resistance. This voltage may be latched as read data at the data latch PDC via the transfer NMOS transistor Q3 and read out to the data lines DL, DLn via the data latch PDC at certain timing.

Figure 13:
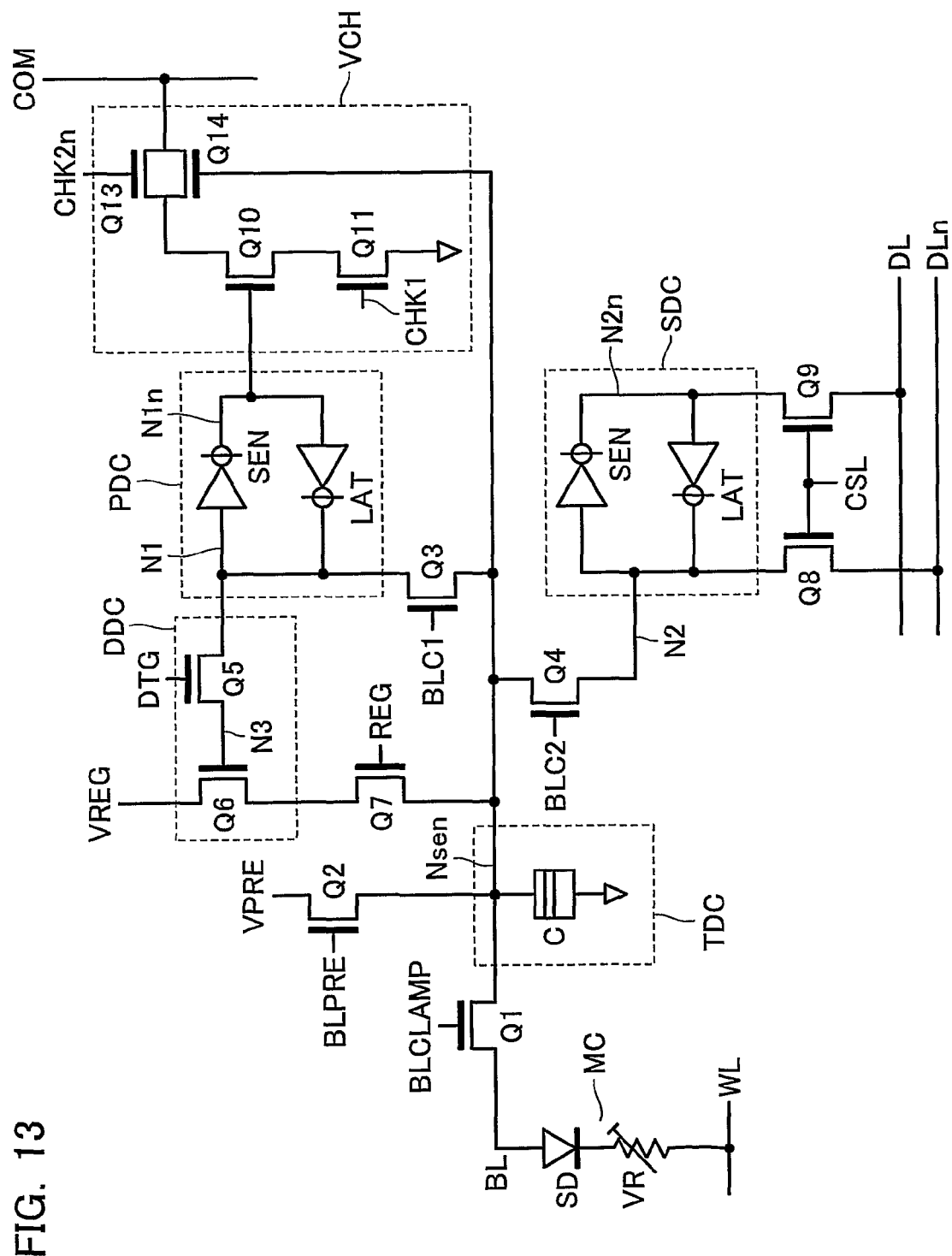
FIG. 13 is a circuit diagram showing a second configuration of a sense amplifier in the same embodiment.

The sense amplifier shown in FIG. 13 corresponds to the circuit of FIG. 10 and differs from the circuit of FIG. 12 in the polarity of the diode SD in the memory cell MC. In the case of this sense amplifier, the precharge NMOS transistor Q2 is turned on to precharge the charge holding capacitor C. Then, the clamp NMOS transistor Q1 is given a certain gate voltage VBLC+Vt at the gate. In this case, the resistance of the memory cell MC is determined in accordance with the fact that the charge on the capacitor C can be discharged to the bit line BL or not. The voltage on the sense node Nsen exhibits "L" when the memory cell MC has a low resistance and "H" when it has a high resistance. This voltage may be latched as read data at the data latch PDC via the transfer NMOS transistor Q3 and read out to the data lines DL, DLn via the data latch SDC at certain timing.

Figure 14:
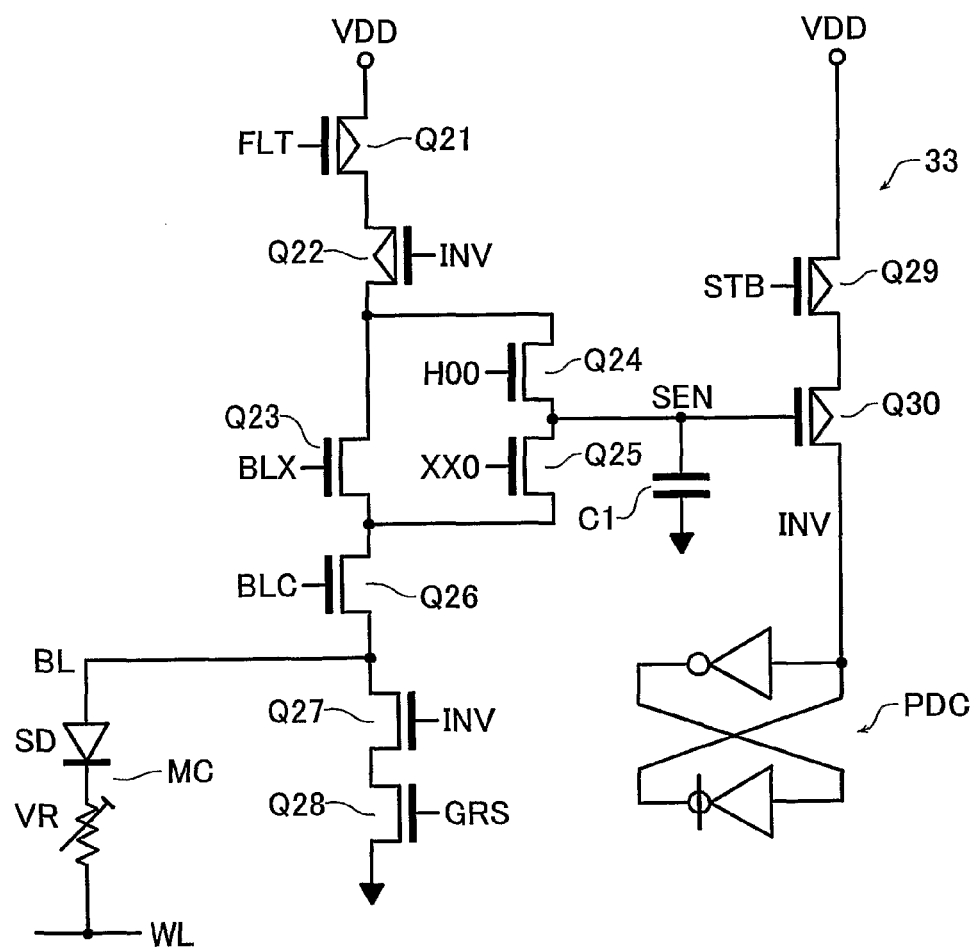
FIG. 14 is a circuit diagram showing a third configuration of a sense amplifier in the same embodiment.

FIG. 14 corresponds to the circuit of FIG. 10 and shows a sense amplifier of the ABL (All Bit Line) type. This sense amplifier controls the bit line potential to be fixed always to a constant voltage during sense operation to exclude the influence between adjoining bit lines and sense all bit lines in parallel.

This sense amplifier precharges a sensing capacitor C1 via transistors Q21, Q22, Q24 and precharges the bit line BL via transistors Q21-Q26. After this precharge period elapsed, the precharge path to the capacitor C1 is disconnected, followed by forming a path for discharging the charge stored on the capacitor C1 via the transistors Q25, Q26 and the bit line BL. In this state, transistors Q29, Q30 contained in a current discriminating circuit are used to sense if the charge on the capacitor C1 is discharged or not. This result is stored in the data latch PDC. The latched data or the voltage on the sense node Nsen exhibits "H" when the memory cell MC has a low resistance and "L" when it has a high resistance.

Figure 15:
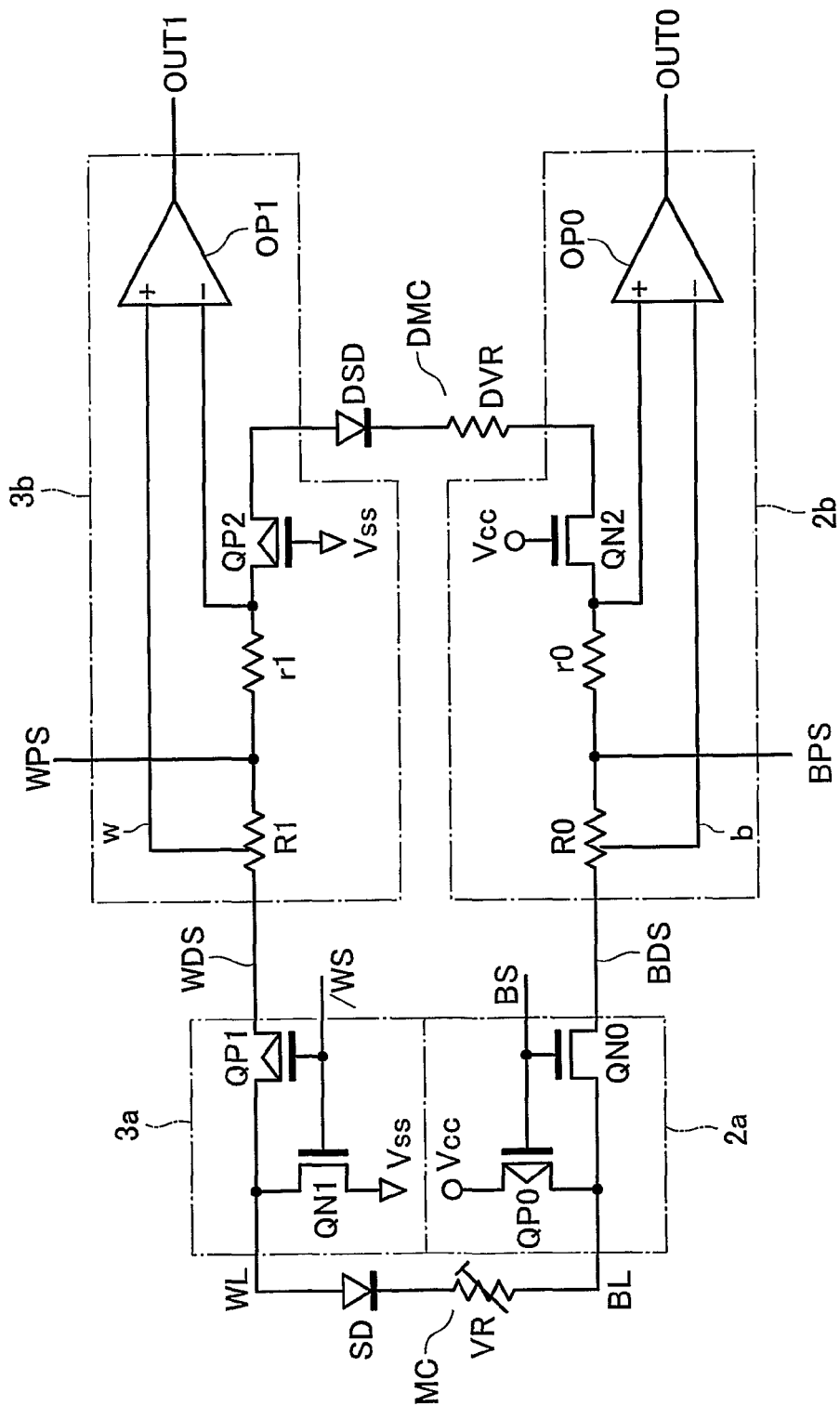
FIG. 15 is a circuit diagram showing a fourth configuration of a sense amplifier in the same embodiment.

The sense amplifier circuits 2b, 3b shown in FIG. 15 comprise sense amplifiers of the current detection type arranged in the column control circuit 2 and the row control circuit 3. They include resistors R0, R1 serving as elements for converting the current flowing in a selected cell into a voltage, a dummy cell DMC, resistors r0, r1 for converting the current flowing in the dummy cell DMC into a voltage, and opamps OP0, OP1.

A word line WL in the cell array is selected by a selection PMOS transistor QP1 driven with a word line selection signal /WS as the output from the row control circuit 3. It is connected via the drive sense line WDS and via the resistor R1 to a high potential source line WPS. A bit line BL is selected by a selection NMOS transistor QN0 driven with a selection signal BS as the output from the column selection circuit 2. It is connected via the drive sense line BDS to a low potential source line BPS.

The dummy cell DMC equivalent to the memory cell MC includes a dummy diode DSD and a dummy resistor DVR and has a middle resistance between binary data resistances in the memory cell MC. The dummy cell DMC has one end connected via a PMOS transistor QP2 and via the resistor r1 to the high potential source line WPS. The PMOS transistor QP2 is a dummy element of the selection PMOS transistor QP1 and always driven on. The dummy cell DMC has the other end connected via an NMOS transistor QN2 and via the resistor r0 to the low potential source line BPS. The NMOS transistor QN2 is a dummy element of the selection NMOS transistor QN0 and always driven on.

The sense amplifier includes two opamps OP0, OP1 in the major part. The opamp OP0 has a non-inverting input terminal supplied with an appropriate voltage of the output b from the center tap of the resistor r0 and an inverting input terminal supplied with a voltage on a connection node between the resistor r0 and the NMOS transistor QN0. The opamp OP1 has an inverting input terminal supplied with an appropriate voltage of the output w from the center tap of the resistor R1 and a non-inverting input terminal supplied with a voltage on a connection node between the resistor r1 and the PMOS transistor QP2.

The following description is given to operation of the sense amplifier circuits 2b, 3b thus configured. As described above, in the non-selected state, the word line WL is kept at "L" level and the bit line BL at "H" level. At the time of selection, the word line selection signal /WS is set at "L" and the bit line selection signal BS at "H". When the high potential source line WPS is given "H" level=Vcc and the low potential source line BPS is given "L" level=Vss, cell current flows in the selected memory cell MC.

Specifically, the resistors R0, R1, r0, r1 may have the following relation. For example, the resistance of the resistor R0 between the terminal BPS and the center tap for providing the voltage output b to the opamp OP0 may be equal to the resistor r0. Similarly, the resistance of the resistor R1 between the terminal WPS and the center tap for providing the voltage output w to the opamp OP1 may be equal to the resistor r1. In such the case, if the selected cell is in the high-resistance state (hereinafter referred to as data "1") and the cell current is smaller than the current flowing in the dummy cell DMC, then the outputs from the opamps OP0, OP1 both become "H". In contrast, if the selected cell is in the low-resistance state (hereinafter referred to as data "0") and the larger cell current flows than the current flowing in the dummy cell DMC, then the outputs from the opamps OP0, OP1 both become "L". Thus, data "0", "1" can be distinguished from each other.

The configuration of the sense amplifier circuits 2b, 3b is just shown as a preferred configuration example to be developed to a sense amplifier scheme when memory cell layers are arranged in multiple layers. Therefore, if only the above-described binary storage is considered, it is sufficient to use only one of the opamps OP0, OP1. Alternatively, the relation between connections associated with the inverting input terminal and the non-inverting input terminal of one of the opamps OP0, OP1 may be reversed. In this case, the outputs from the two opamps OP0, OP1 may exhibit "H" for one and "L" for the other in accordance with data. Therefore, a further opamp that receives these two opamp outputs may be prepared to obtain a sense output of "H", "L" corresponding to data "0", "1".

[Data Writing]

The following description is given to write operation with verify in the nonvolatile memory. The present invention is applicable not only to SLC (Single Level Cell) but also to MLC (Multi Level Cell) though the SLC is described first. FIG. 11 shows the distributions of resistances of cells, assuming multi-cell write and verify though those on a cell basis can be considered similarly.

When a write command is provided from an external host, not shown, the write command is fed via the data I/O buffer 4 and transferred via the command interface 6 to the state machine 7. Write data is transferred from the host via the data I/O buffer 6 to the column control circuit 2. The write data is latched at a latch unit in the sense amplifier in the column control circuit 2. The state machine 7 then controls the pulse generator 9 for write.

Figure 16:
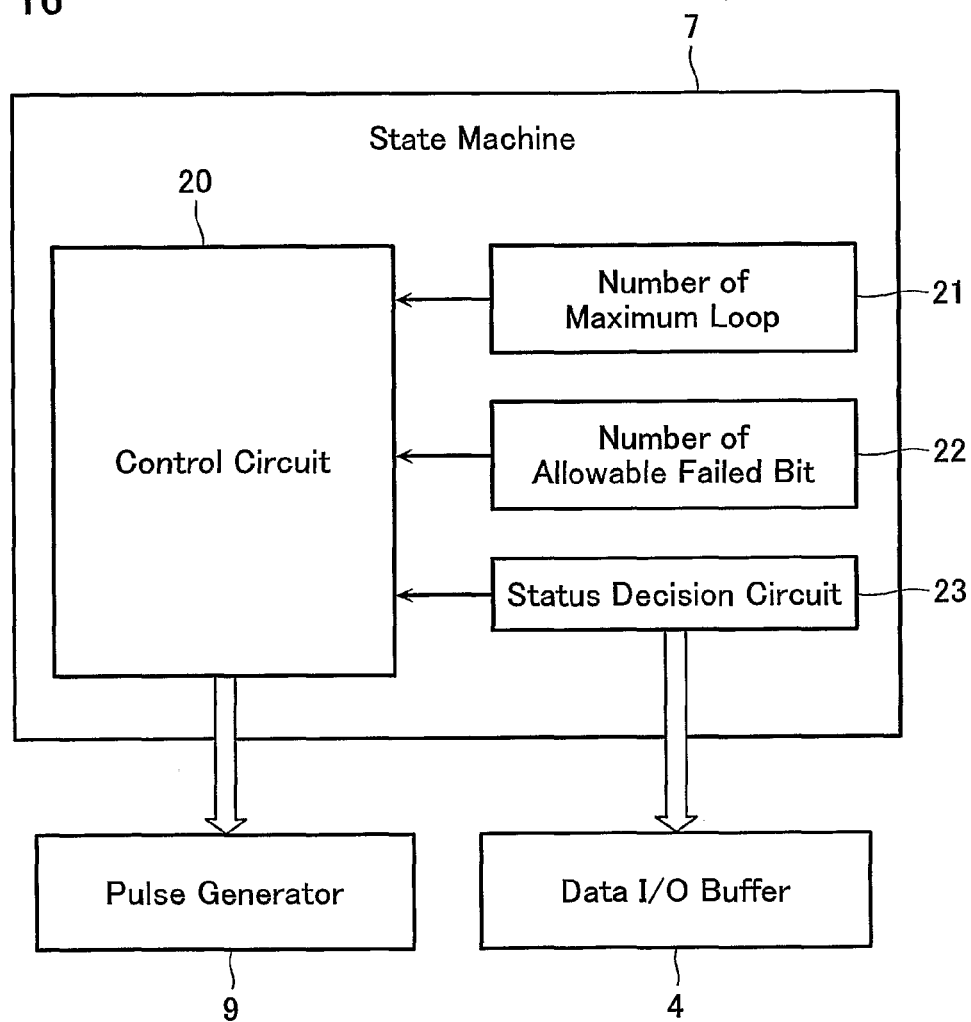
FIG. 16 is a block diagram showing a configuration of a state machine in the same embodiment.

FIG. 16 shows a configuration of the state machine 7 associated with write operation. A control circuit 20 is provided to instruct the pulse generator 9 to generate pulses for data write, read and erase. The control circuit 20 is given settings stored in a number-of-maximum loop storage unit 21 and a number-of-allowable failed bit storage unit 22 and decision results from a status decision circuit 23. The number-of-maximum loop storage unit 21 stores the number of maximum loops that defines the number of maximum write repetitions. The number-of-allowable failed bit storage unit 22 stores the number of error correctable bits with ECC as the number of allowable failed bits. The status decision circuit 23 decides the status information on the verify result.

Figure 17:
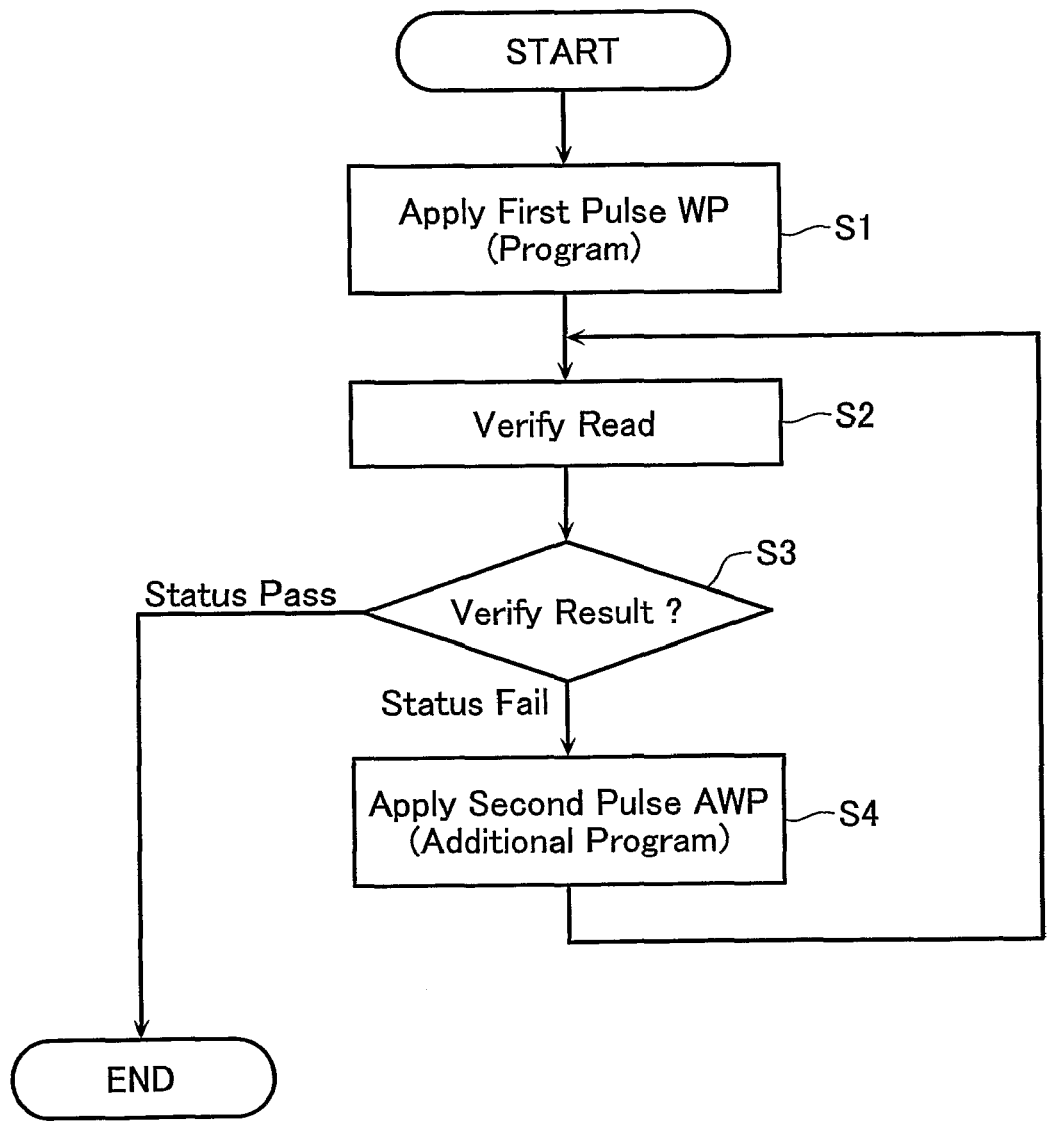
FIG. 17 is a flowchart showing write operation in the same embodiment.
Figure 18:
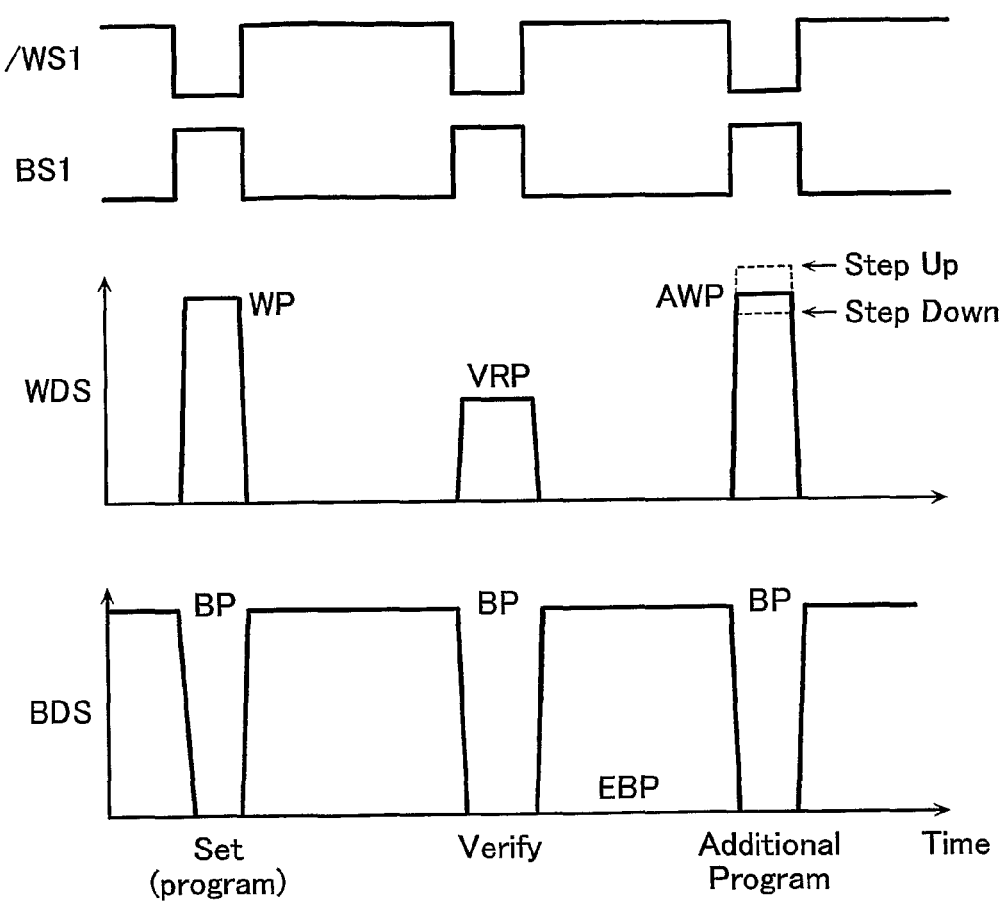
FIG. 18 is a waveform diagram showing selection signals /WS, BS and write pulses WP, BP at the time of data write.

FIG. 17 is a flowchart showing write operation. FIG. 18 is a waveform diagram showing pulses applied to various parts.

Initially, first write pulses WP, BP are generated (S1). Namely, as shown in FIG. 18, in the case of the circuit of FIG. 9, at the time of data set with a variation from the high-resistance state to the low-resistance state, the word line selection signal /WS1 for the word line WL1 corresponding to a data write target memory cell is set at "L" level. In addition, the bit line selection signal BS1 for the bit line BL1 corresponding to the write target memory is set at "H" level. At the same time, the word-line side drive sense line WDS is given write pulses WP, BP for varying the resistance of the variable resistor VR from the erase level to the program level as shown in FIG. 11. The write pulses WP, BP are given from the pulse generator 9 shown in FIG. 1 and has a pulse height of, for example, Vcc level. At the same time, the bit-line side drive sense line BDS is given a negative write pulse BP of Vss level. As a result, the variable resistor VR in the high-resistance state (erased state) can be set in the low-resistance state (programmed state).

Next, verify read is executed (S2). In this case, to the word-line side drive sense line WDS, a verify read pulse VRP required for verify read is applied from the pulse generator 9 as shown in FIG. 18. The verify level is the resistance at the highest resistance side in the resistance distribution of the programmed memory cell MC as shown in FIG. 11. In the shown example, the erased memory cell MC has a distribution of resistances from 1M to 100 kΩ while the written one has a distribution of resistances from 10 k to 1 kΩ. Therefore, the verify level has a resistance of 10 k. In the sense amplifier shown in FIG. 12, the memory cell MC may have a resistance of 10 k. In this case, the voltage VBLC charged on the bit line BL is represented by:

$$VBLC = V_{WB}\{1-\epsilon(-t/C_B*10k)\} \quad \text{[Expression 1]}$$

where $V_{WB}$ denotes the voltage applied across the word line WL and the bit line BL, t denotes the application time, and $C_B$ denotes the capacitance of the bit line BL. The gate voltage BLCLAMP on the clamp transistor Q1 may be set at VBLC+Vt (Vt denotes the threshold voltage of the NMOS transistor Q1). In this case, if the memory cell MC has a resistance smaller than 10 kΩ, then the potential on the bit line BL becomes higher than VBLC, which turns off the clamp transistor Q1 and makes the latched data "H". If the memory cell MC has a resistance larger than 10 kΩ, then the potential on the bit line BL becomes lower than VBLC, which turns on the clamp transistor Q1 and makes the latched data "L". Therefore, the status decision circuit 23 can decide that the status is pass if the latched data is "H" and that the status is fail if the latched data is "L" (S3).

In the case of the sense amplifiers shown in FIGS. 13 and 14, the amounts of charge stored in the capacitors C, C1 can be adjusted with the precharge time to set the verify level. In the case of the sense amplifier shown in FIG. 15, the resistance of the dummy resistor DVR in the dummy cell DMC may be set at the resistance of the verify level. In this case, the dummy cell DMC to be connected may be switched between those at the time of normal read and at the time of verify.

In the case of simultaneous multi-bit write, the status may be decided in batch in the column control circuit 2 after the data is latched at the data latch (PDC) in the sense amplifier. In the case of bit-basis write, it is sufficient to identify it on one bit. The batch sense result is transferred to the state machine 7 into the status decision circuit 23. This result is decided at the control circuit 20. If the status is pass, meaning that write is finished, the control terminates the programming in the nonvolatile semiconductor memory device (S3). If the status is fail on the other hand, meaning that write is not yet finished, a second write pulse AWP is given (S4). In this case, the additional pulse enables voltage-level variable, step-up write or step-down write as shown in FIG. 18. The pulse width may be varied. The status decision circuit 23 may have a function of deciding the extent of write not yet completed. Based on this information, the control circuit 20 can control the pulse generator 9 as an additional program in FIG. 18. Specifically, with detection of the value of current flowing in the sense amplifier, the status decision circuit 23 may detect the resistance of the memory cell MC and perform control based on the detection value. The control target in this case includes the width or magnitude of the voltage pulse or the step width. Thus, executing verify, feeding back the result to the next pulse, and repeating these operations may enable such write that tightens the resistance distribution width with plural pulses.

Second Embodiment

Figure 19:
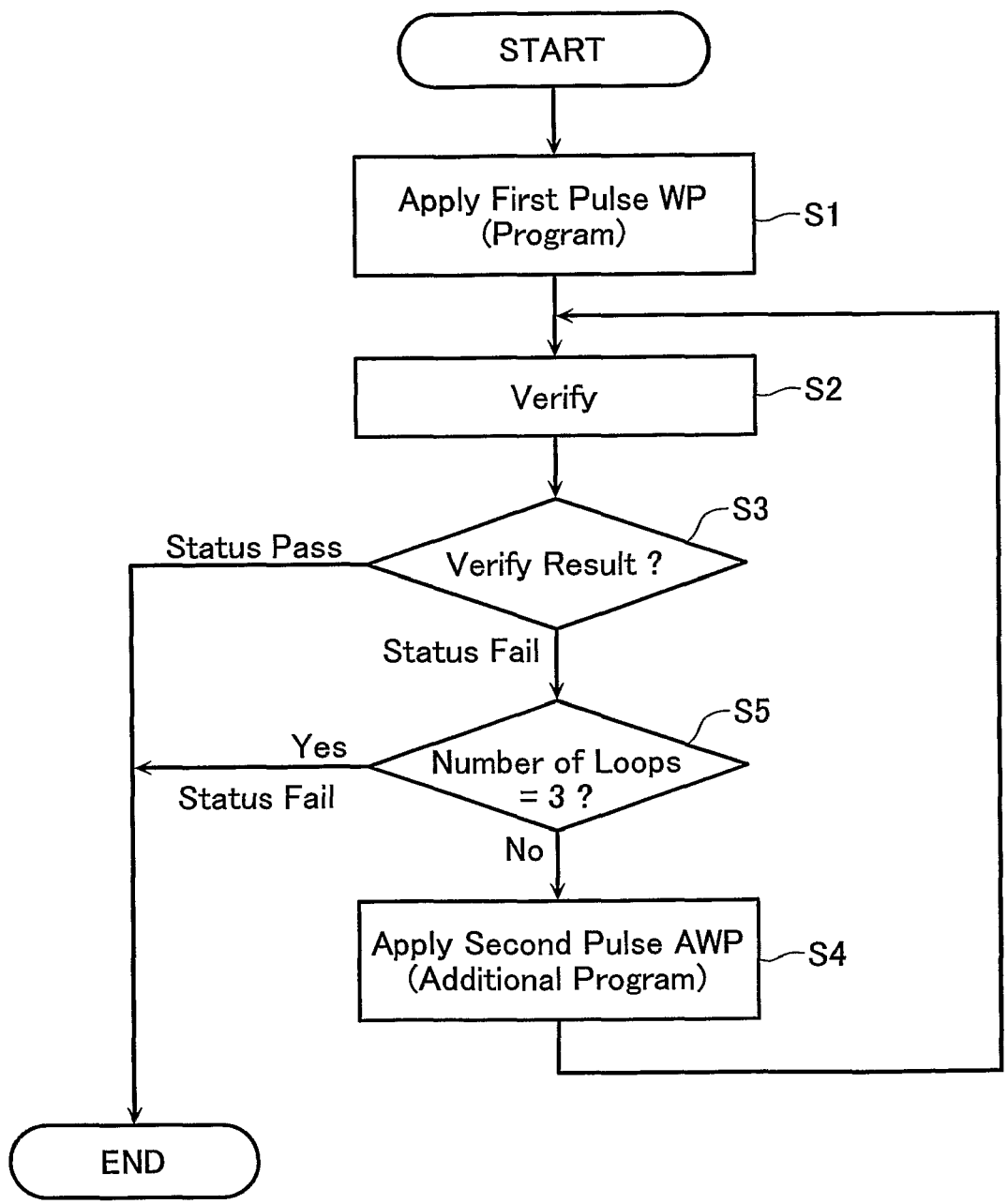
FIG. 19 is a flowchart showing write operation in a second embodiment of the present invention.

FIG. 19 is a flowchart showing write operation according to a second embodiment of the present invention.

The flow of write in FIG. 17 may be considered to fail in write even through as many times of write as possible. In this case, a problem arises if stacked before the operation is completed. Accordingly, the number of maximum loops is set. In the present embodiment, the number of maximum loops set in the number-of-maximum loop storage unit 21 of FIG. 16 is equal to 3. The program with the first and second pulses and the verify set are contained in one loop. If write is not finished (S3), then the programming terminates after 3 loops (S5). In this case, the status decision circuit 23 is set fail, and this information is transferred through the data I/O buffer 4 to the external host. As a result, the host can read the pass/fail information and identify the completion/incompletion of write.

Third Embodiment

Figure 20:
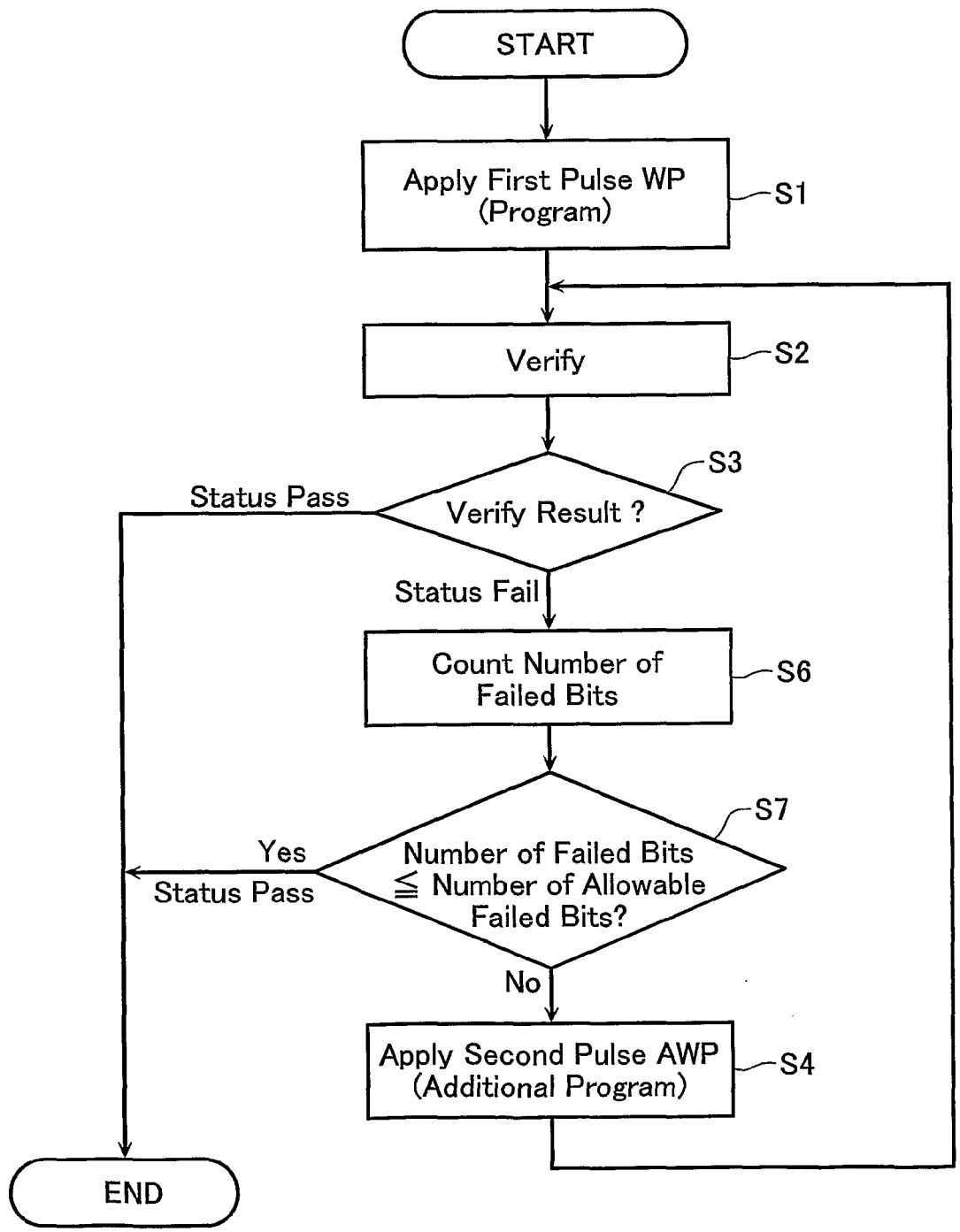
FIG. 20 is a flowchart showing write operation in a third embodiment of the present invention.

FIG. 20 is a flowchart showing write operation according to a third embodiment of the present invention.

Figure 21:
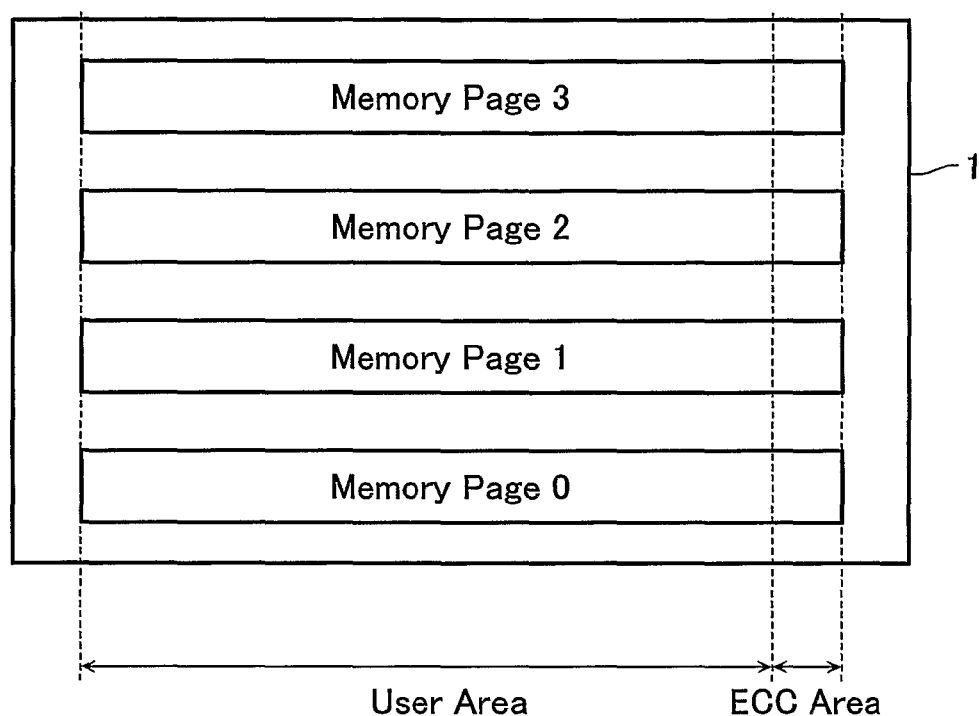
FIG. 21 shows a storage area in a memory cell in the same embodiment.

As shown in FIG. 16, the state machine 7 can set the number of allowable failed bits in the number-of-allowable failed bit storage unit 22. The allowable failed bits are provided in consideration of ECC (Error Correction Code) relief. When page-basis write is assumed, an ECC area may be prepared in the page as shown in FIG. 21. Thus, even if write is completed to terminate operation while allowing failed bits, ECC relief is executed at the time of reading the data and the original write-intended data can be read out without error.

At the time of multi-bit write, the number of failed bits is counted if the verify result is fail as shown in FIG. 20 (S6). The number of failed bits may be counted with the use of a system for detecting the value of the current in accordance with the number of failed bits based on the verify result stored in the latch unit. If the number of failed bits≦the number of allowable failed bits, then the status is made pass and write is finished (S7). If the number of failed bits>the number of allowable failed bits, then the status is made fail and the additional program is executed with the second pulse AWP (S4).

In this case, even if write can not be finished due to some cause like the above, the number of maximum loops is determined and then write operation is finished. In addition, the status is made fail and transferred to the host. Further, as counting of the failed bits is time-consuming, the counting may be started from an arbitrary number of loops to improve the write performance.

With a combination of program, verify and other functions as above, write operation in the nonvolatile memory using variable resistors makes it possible to execute write to any resistance level.

Fourth Embodiment

Figure 22A:
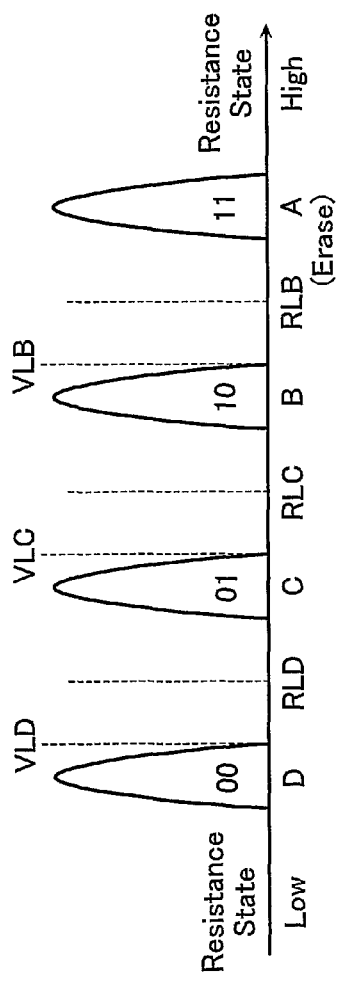
FIG. 22A provides graphs showing resistance distributions and data in a memory cell in the case of multivalue storage.
Figure 22B:
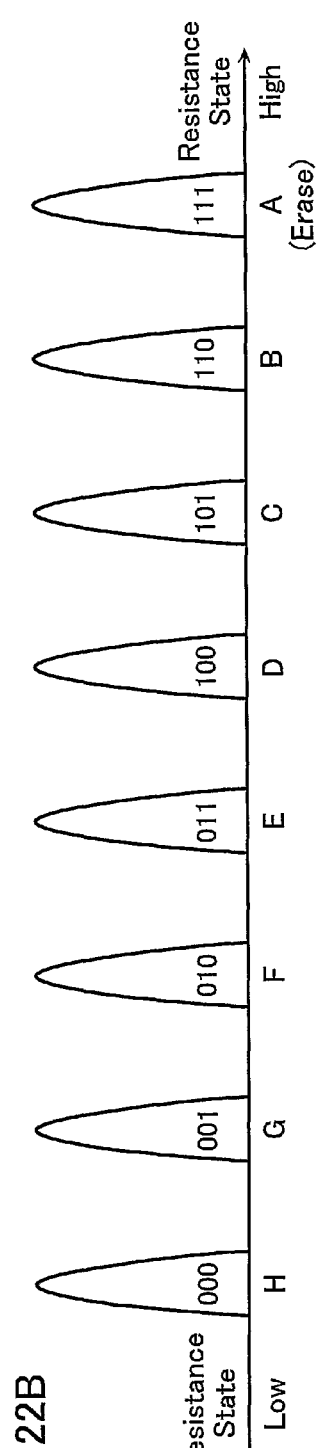
FIG. 22B provides graphs showing resistance distributions and data in a memory cell in the case of multivalue storage.
Figure 22C:
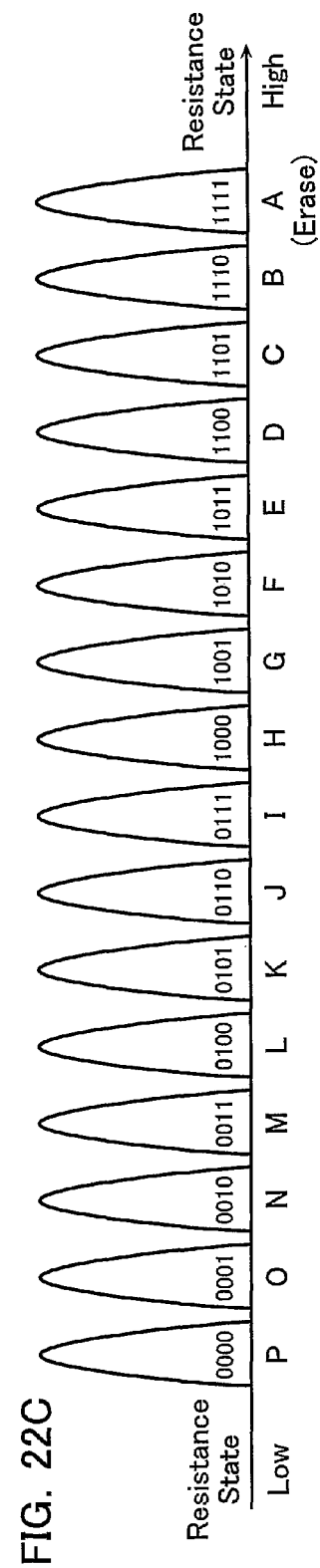
FIG. 22C provides graphs showing resistance distributions and data in a memory cell in the case of multivalue storage.

The following description is given to a fourth embodiment of the present invention applied to MLC. FIGS. 22A-22C provide graphs showing relations between resistance distributions and data in a memory cell in the case of multivalue storage. FIG. 22A shows an example of 2-bit data storage in each memory cell MC, in which write in each memory cell MC is executed as contained in 4 resistance distributions A-D. The distributions correspond to 2-bit data "11", "10", "01", "00" sequentially from the higher resistance distribution A. FIG. 22B shows an example of 3-bit data storage in each memory cell MC, in which write in each memory cell MC is executed as contained in 8 resistance distributions A-H. The distributions correspond to 3-bit data "111", "110", "101", "100", "011", "010", "001", "000" sequentially from the higher resistance distribution A. FIG. 22C shows an example of 4-bit data storage in each memory cell MC, in which write in each memory cell MC is executed as contained in 16 resistance distributions A-P. The distributions correspond to 4-bit data "1111", "1110", "1101", "1100", . . . , "0011", . . . , "0010", "0001", "0000" sequentially from the higher resistance distribution A.

Even multivalue data write may be considered to include simultaneous write to plural cells and individual write to each cell similar to binary. In the case of the former, it is required to execute verify at every level after providing a pulse. For example, in the case of quaternary write shown in FIG. 22A, the maximum resistances in the resistance distributions B, C, D corresponding to data "10", "01", "00" are set at verify levels VLB, VLC, VLD. These verify levels VLB, VLC, VLD may be set with voltages given to the sense amplifier.

For example, in the case of the sense amplifier of FIG. 12, the gate voltage VBLC+Vt on the clamp transistor Q1 may be determined by the following expression in accordance with the verify level $R_{VF}$ and switched to repeat verify.

$$VBLC=V_{WB}\{1-\epsilon(-t/C_B*R_{VF})\} \quad \text{[Expression 2]}$$

In the case of the sense amplifiers shown in FIGS. 13 and 14, the precharge currents through the precharge transistors Q2, Q21 are varied in accordance with the verify level. In the case of FIG. 15, the dummy cell DMC may be switched in accordance with the verify level.

The latched data in each sense amplifier is used to decide which level to write. In the case of simultaneous write to plural cells, all cells are verified at all levels. An arithmetic function is contained inside or outside the sense amplifier. A verify result at a verify-intended level is taken into the latch and other verify results may be neglected. In the case of verify pass in each memory cell after verified at all levels, write is noy required more than that. Accordingly, a non-selection voltage is transferred to the bit line BL at the next program pulse. In contrast, in the case of write incompleted, further write is executed. Other operations than the above are similar to those in the first through third embodiments. It is also possible to divide a 2-bit cell into 2 pages, of which bits are written one by one. In this case, the first bit is written at any resistance distribution level and then the next bit is written as MLC in FIG. 21.

Also in the case of a memory with more bits/cells such as those in FIGS. 22B and C, the above consideration may be applied.

In the case of cell-basis write, input data can specify which level to write. Therefore, verify write can be executed at a specific verify level after application of a program pulse.

Figure 23:
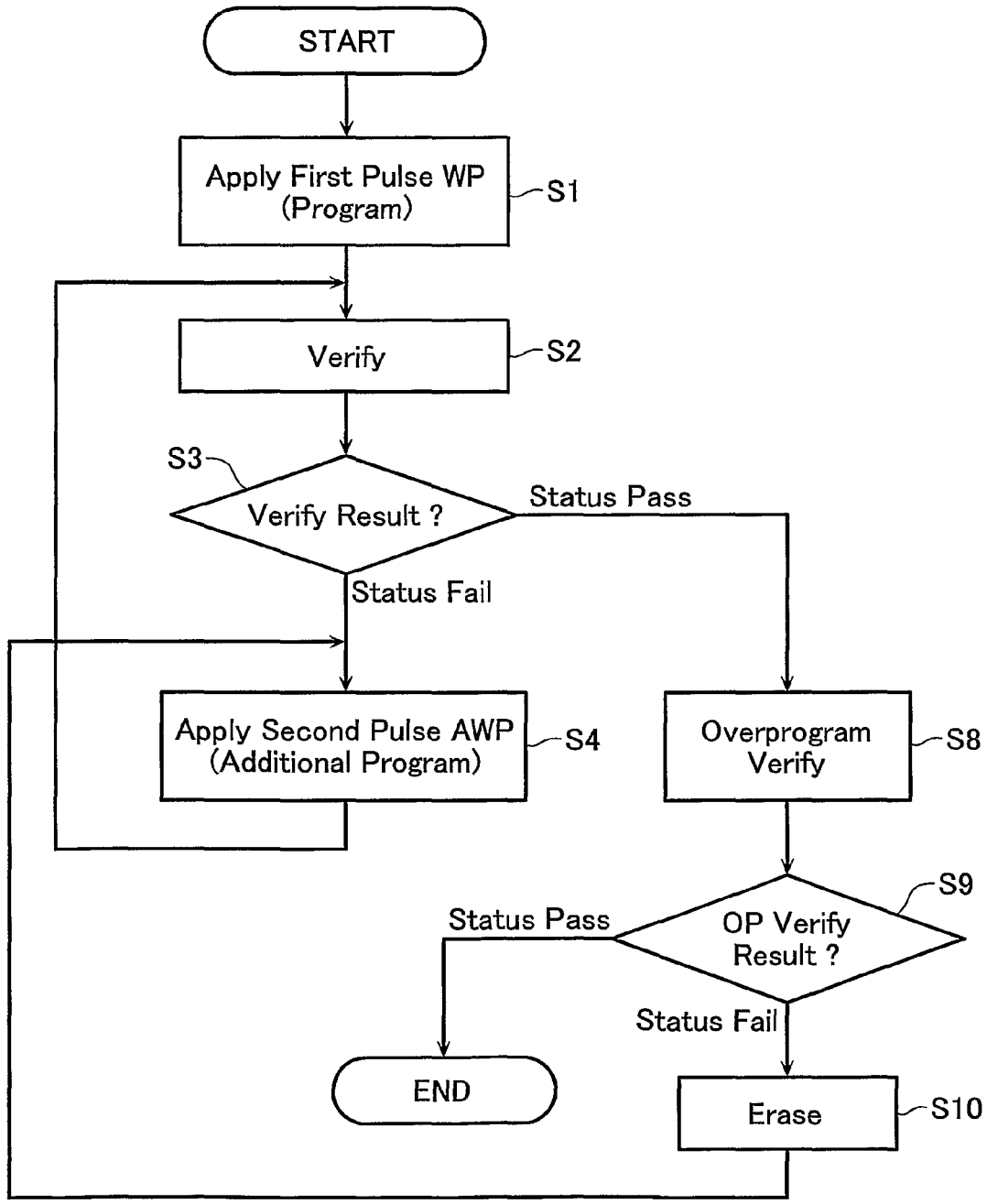
FIG. 23 is a flowchart showing write operation in a fourth embodiment of the present invention.

An algorithm at that time is shown in FIG. 23. Initially, a first pulse WP is applied to execute program (S1). Next, verify is executed (S2). The verify can be executed at any level in accordance with write data. If the status decision result indicates fail, then a second pulse AWP is used to execute additional write (S4). In this case, the pulse can be formed on the basis of the verify result as described in the first embodiment. If the status decision result indicates pass, then the flow jumps to step S8 to execute overprogram verify. This verify is executed at one-level higher read levels RLa, RLb, RLc than the write-intended resistance level as shown in FIG. 22A. For example, if write is executed at C level (="01"), then verify is executed at a verify level VLC after program pulse application, and overprogram verify is executed at a read level RLD. This makes it possible to sense the cell written in a distribution higher than the write-intended resistance distribution. If the status result from this overprogram verify indicates pass, meaning the success of write to any resistance, then the control terminates the program (S9). If the status result indicates fail, the flow goes to step S10 to erase the concerned cell (S10). Thereafter, the flow returns to step S2 to write again (S4). With the above method, verify write can be executed to achieve write at any resistance level. At the same time, overprogram verify can be executed to prevent overprogram of the cell.

Fifth Embodiment

Figure 24:
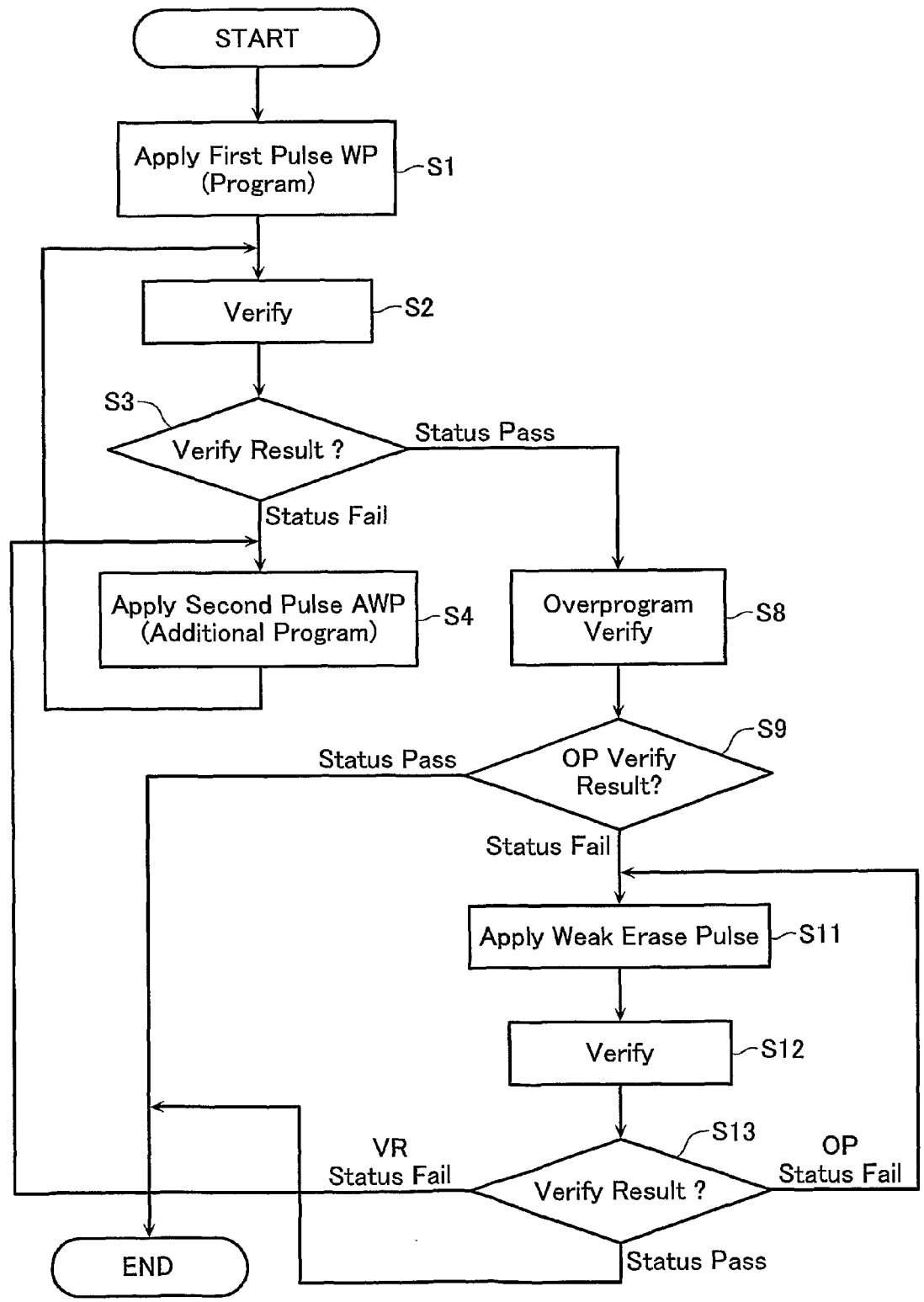
FIG. 24 is a flowchart showing write operation in a fifth embodiment of the present invention.

FIG. 24 is a flowchart showing yet another embodiment of the present invention.

Steps S1-S9 in this embodiment are similar to those in the fourth embodiment. In this embodiment, if the overprogram verify makes the status fail, a weak erase pulse is applied to the memory cell MC (S11), thereby enabling the memory cell not to be erased completely but erased slightly. The pulse magnitude and pulse width of the weak erase pulse can be determined from the verify result. Thereafter, verify is executed (S12). This verify may include execution of both normal verify and overprogram verify or either one. In the execution of both, the AND of statuses is obtained and, if the result indicates pass, then write is finished (S13) In the case of normal verify fail, a second pulse AWP following step S4 is given. In the case of overprogram verify, a weak erase pulse is given again (S11). Other operations are similar to those in the fourth embodiment.

Sixth Embodiment

Figure 25:
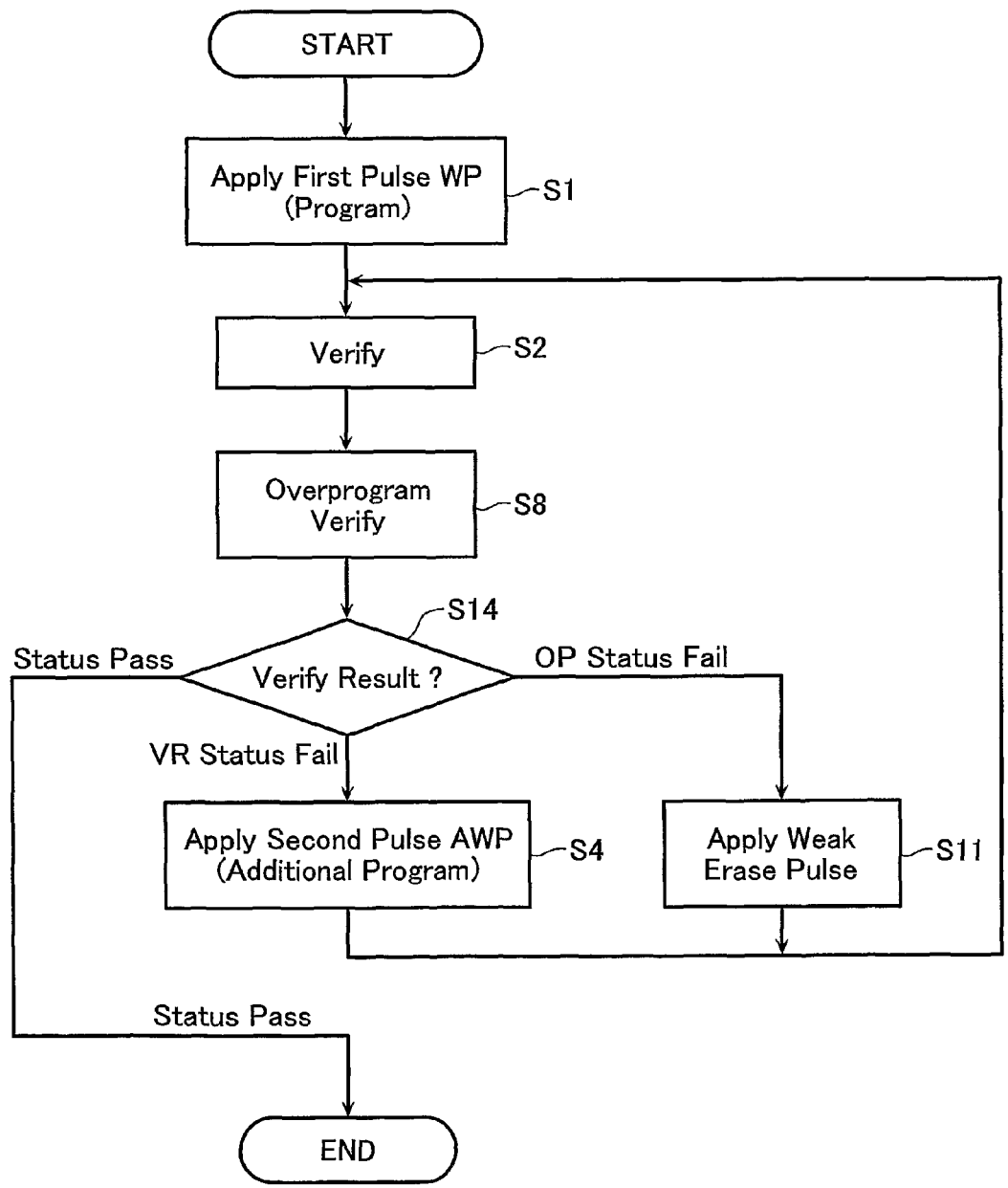
FIG. 25 is a flowchart showing write operation in a sixth embodiment of the present invention.

FIG. 25 is a flowchart showing write operation in a sixth embodiment of the present invention. In this embodiment, verify and overprogram verify are executed successively (S2, S8), thereby efficiently executing two types of verify.

Other Embodiments

In simultaneous write to plural cells, write and verify may be executed in batch and an erase pulse and a weak erase pulse may be realized on a cell basis. Further, erase and weak erase operations may be achieved in the bipolar operation with voltages applied in the opposite directions in accordance with the device structure. Alternatively, it may be achieved in the unipolar operation with a voltage applied in the same direction for a long time.

With such the method, verify write enables write to any resistance level. At the same time, overprogram verify can prevent overprogram of the cell. In addition, application of the weak erase pulse can improve the performance associated with the write speed.

Figure 26A:
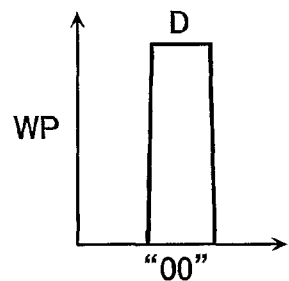
FIG. 26A is a waveform diagram showing a first generation example of write pulses in the above embodiments.
Figure 26B:
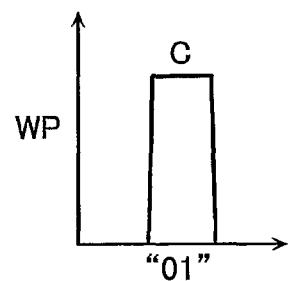
FIG. 26B is a waveform diagram showing a first generation example of write pulses in the above embodiments.
Figure 26C:
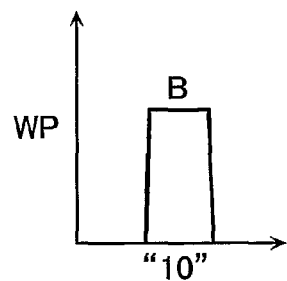
FIG. 26C is a waveform diagram showing a first generation example of write pulses in the above embodiments.

An example of multi-data write pulse formation is shown in FIGS. 26A-26C. This example is an example that varies the pulse voltage of the write pulse in accordance with input data. It is assumed that the erased state ("11") of the variable resistor VR shown herein is at A level. In this case, when input data is "00", then a write pulse WP having the highest pulse height (Vcc) is generated as shown in FIG. 26A. When input data is "01", then a write pulse WP having a one-step lower height than the highest pulse height is generated as shown in FIG. 26B. When input data is "10", then a write pulse WP having the lowest pulse height is generated as shown in FIG. 26C. These write pulses WP are required to have voltages and pulse widths that can shift the resistance of the variable resistor VR to levels D, C, B shown in FIG. 22.

Figure 27A:
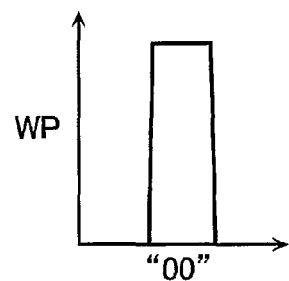
FIG. 27A is a waveform diagram showing a second generation example of write pulses in the above embodiments.
Figure 27B:
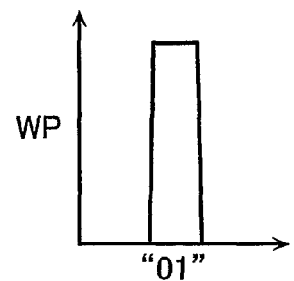
FIG. 27B is a waveform diagram showing a second generation example of write pulses in the above embodiments.
Figure 27C:
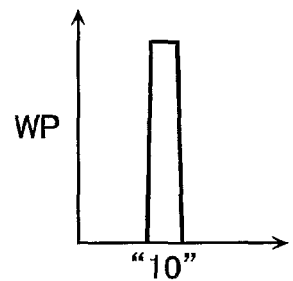
FIG. 27C is a waveform diagram showing a second generation example of write pulses in the above embodiments.

FIGS. 27A-27C show another example of write pulse formation.

In this embodiment, input data is used to vary the pulse width of the write pulse. It is assumed that the erased state ("11") is at A level. In this case, when input data is "00", then a write pulse WP having the largest pulse width is generated as shown in FIG. 27A. When input data is "01", then a write pulse WP having a one-step narrower pulse width than the largest pulse width is generated as shown in FIG. 27B. When input data is "10", then a write pulse WP having the narrowest pulse width is generated as shown in FIG. 27C. These write pulses WP are required to have voltages and pulse widths that can shift the resistance of the variable resistor VR to levels D, C, B shown in FIG. 22.

Figure 28:
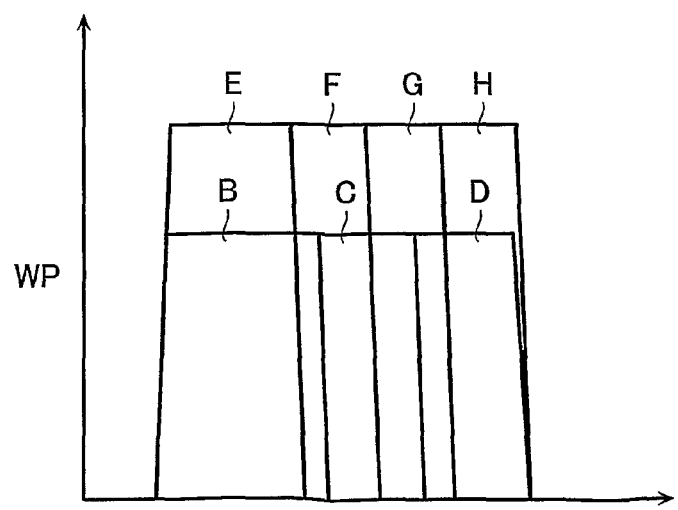
FIG. 28 is a waveform diagram showing a third generation example of write pulses in the above embodiments.

FIG. 28 shows an example of the octonary data write pulse WP, which can vary write power with the pulse width and the pulse height in combination. Namely, it is assumed that the erased state ("111") is at A level. In this case, when input data is "000", then a write pulse H having the largest pulse height and the widest pulse width is selected. When input data is "110", then a write pulse B having the smallest pulse height and the narrowest pulse width is selected.

Figure 29:
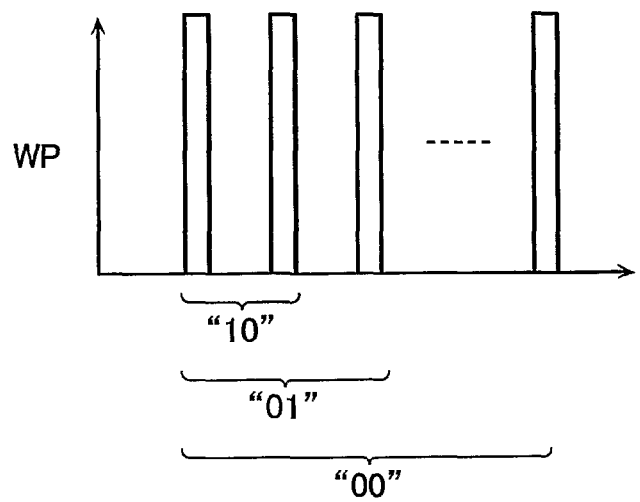
FIG. 29 is a waveform diagram showing a fourth generation example of write pulses in the above embodiments.

FIG. 29 is a waveform diagram showing write pulses for use in step-up or step-down write. In this case, the number of write pulses WP varies the resistance of the variable resistor VR. In execution of such the step-up or step-down write, the input of write data may be used to form the initial pulse, thereby reducing the write time. In addition to the number of pulses, the step width may be altered.

Figure 30:
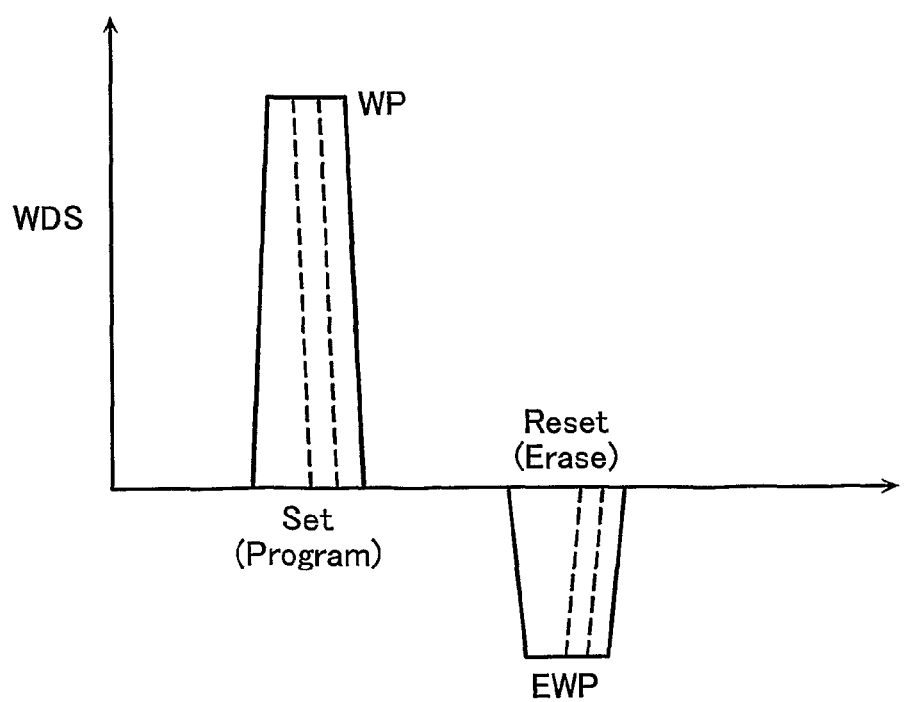
FIG. 30 is a waveform diagram showing a generation example of write and erase pulses in another embodiment.

The foregoing is described on the unipolar operation in which the write pulse and the erase pulse have an identical polarity. The invention is also applicable to a nonvolatile memory of the bipolar operation type. FIG. 30 shows an example in utilizing the asymmetric property of the non-ohmic element NO to apply a reverse-direction pulse to the variable resistor VR as the erase pulse EWP. The above-described variable resistor can be reset by application of a reverse-direction voltage as known. In this case, the write pulse WP may be changed in multiple stages and the pulse width or pulse height of the reverse-polarity erase pulse may be changed additionally to change the level of the weak erase pulse.

The above-described memory cell array is not particularly limited to the single-layered structure. If it is arranged in multiple layers, the data storage capacity can be increased additionally. In that case, even if part of word lines and bit lines are shared by an upper and a lower layer, detecting the value of current flowing in each line in consideration of the direction of current flow allows multivalue data to be read out.

The present invention is also applicable to a probe memory using a variable resistor in a recording layer.

The invention claimed is:

1. A nonvolatile semiconductor memory device, comprising:
a memory cell array of electrically erasable programmable nonvolatile memory cells arranged in a matrix, each memory cell using a variable resistor;
a pulse generator operative to generate plural types of write pulses for varying the resistance of said variable resistor based on write data;
a selection circuit operative to apply write pulses generated by said pulse generator to one of said memory cells;
a sense amplifier operative to execute verify read to said memory cell;
a status decision circuit operative to decide a verify result based on an output from said sense amplifier; and
a control circuit operative to execute additional write to said memory cell based on said verify result from said status decision circuit,
wherein said sense amplifier executes verify read to plural memory cells in batch, and
wherein said control circuit makes the verify result pass if a number of bits with the verify result indicative of fail is not more than a number of pre-determined allowable failed bits.

2. The nonvolatile semiconductor memory device according to claim 1, wherein said control circuit executes said additional write with an additional write pulse different in voltage level or pulse width from said write pulse.

3. The nonvolatile semiconductor memory device according to claim 1, wherein said status decision circuit decides the varied extent of the resistance of said memory cell together with the decision of the verify result, and
wherein said control circuit controls the voltage level or pulse width of said additional write pulse based on resistance variation information about said memory cell provided from said status decision circuit.

4. The nonvolatile semiconductor memory device according to claim 1, wherein said control circuit repeats said additional write until said verify result becomes pass within a range not more than a number of pre-determined maximum loops.

5. The nonvolatile semiconductor memory device according to claim 4, wherein said control circuit repeats said additional write until a number of repetitions reaches the number of pre-determined maximum loops, and
wherein said status decision circuit makes the verify result fail if data is not written in said memory cell when a number of repetitions of said additional write reaches the number of pre-determined maximum loops.

6. The nonvolatile semiconductor memory device according to claim 1, wherein said control circuit repeats said additional write until said verify result becomes pass within a range not more than a number of pre-determined maximum loops, and counts a number of bits with the verify result indicative of fail, starting from an arbitrary number of loops.

7. The nonvolatile semiconductor memory device according to claim 1, wherein said sense amplifier executes overprogram verify read to said memory cell, and wherein said control circuit applies an erase pulse generated at said pulse generator to said memory cell if an overprogram verify result indicates fail.

8. The nonvolatile semiconductor memory device according to claim 7, wherein said control circuit applies a weak erase pulse generated at said pulse generator to said memory cell if the overprogram verify result indicates fail.

9. A nonvolatile semiconductor memory device, comprising:
- a memory cell array of electrically erasable programmable nonvolatile memory cells arranged in a matrix, each memory cell using a variable resistor;
- a pulse generator operative to generate plural types of write pulses for varying a resistance of said variable resistor in three or more stages based on ternary or higher valued write data;
- a selection circuit operative to apply write pulses generated by said pulse generator to one of said memory cells;
- a sense amplifier operative to execute verify read to said memory cell;
- a status decision circuit operative to decide a verify result based on an output from said sense amplifier; and
- a control circuit operative to execute additional write to said memory cell based on said verify result from said status decision circuit,
- wherein said selection circuit executes write to plural of said memory cells simultaneously,
- wherein said sense amplifier sets plural verify levels corresponding to the resistances of said variable resistor in three or more stages and executes verify read to plural of said memory cells in batch based on said plural verify levels, and
- wherein said control circuits executes said additional write to said memory cells with said verify result indicative of fail.

10. The nonvolatile semiconductor memory device according to claim 9, wherein said control circuit repeats said additional write until said verify result becomes pass within a range not more than a number of pre-determined maximum loops.

11. The nonvolatile semiconductor memory device according to claim 9, wherein said sense amplifier executes overprogram verify read to said memory cell, and wherein said control circuit applies an erase pulse generated at said pulse generator to said memory cell if an overprogram verify result indicates fail.

12. The nonvolatile semiconductor memory device according to claim 11,
wherein said control circuits applies said erase pulse to each said memory cell.

13. The nonvolatile semiconductor memory device according to claim 11, wherein said control circuit applies a weak erase pulse generated at said pulse generator to said memory cell if an overprogram verify result indicates fail.

14. The nonvolatile semiconductor memory device according to claim 13,
wherein said control circuits applies said weak erase pulse to each said memory cell.

15. A nonvolatile semiconductor memory device, comprising:
- a memory cell array including a cell array of electrically erasable programmable nonvolatile memory cells arranged in a matrix and an ECC (Error Correction Code) area, each memory cell using a variable resistor;
- a pulse generator operative to generate plural types of write pulses for varying the resistance of said variable resistor based on write data;
- a selection circuit operative to apply write pulses generated by said pulse generator to one of said memory cells;
- a sense amplifier operative to execute verify read to said memory cell;
- a status decision circuit operative to decide whether a verify result falls within an ECC relievable range based on an output from said sense amplifier; and
- a control circuit operative to execute additional write to said memory cell based on said verify result from said status decision circuit,
- wherein said sense amplifier executes verify read to plural memory cells in batch, and
- wherein said control circuit makes the verify result pass if a number of bits with the verify result indicative of fail is not more than a number of pre-determined allowable failed bits.

* * * * *